US006586782B1

United States Patent
Finlay

(10) Patent No.: US 6,586,782 B1
(45) Date of Patent: Jul. 1, 2003

(54) TRANSISTOR LAYOUT HAVING A HEAT DISSIPATIVE EMITTER

(75) Inventor: Hugh J. Finlay, Moorpark, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 65 days.

(21) Appl. No.: 09/861,921

(22) Filed: May 21, 2001

Related U.S. Application Data

(63) Continuation-in-part of application No. 09/126,301, filed on Jul. 30, 1998, now Pat. No. 6,236,071.

(51) Int. Cl.[7] ................. H01L 31/0328; H01L 31/0336; H01L 27/082; H01L 27/102; H01L 29/70

(52) U.S. Cl. ................. 257/197; 257/198; 257/571; 257/578; 257/586; 257/591; 257/592; 257/593

(58) Field of Search ................. 257/197, 198, 257/571, 578, 582, 586, 591, 592, 593, 514

(56) References Cited

U.S. PATENT DOCUMENTS

| 3,063,879 A | | 11/1962 | Strull | 257/578 |
| 5,637,901 A | * | 6/1997 | Beigel et al. | 257/586 |
| 5,786,622 A | * | 7/1998 | Ronkainen | 257/578 |
| 5,850,101 A | * | 12/1998 | Iranmanesh | 257/592 |
| 5,939,739 A | | 8/1999 | O'Keefe | 257/197 |

FOREIGN PATENT DOCUMENTS

JP 61-220465 * 9/1986 ................. 257/514

* cited by examiner

Primary Examiner—Steven Loke
(74) Attorney, Agent, or Firm—Thomas, Kayden, Horstemeyer & Risley, LLP

(57) ABSTRACT

Various embodiments of a novel transistor layout having improved electrical and heat dissipation characteristics are disclosed. Several embodiments include various intrinsic components contoured to the shape of the emitter. The various intrinsic components may include a collector layer center portion, a collector contact, a base pedestal, and/or a base contact. Additional embodiments include improved heat dissipation within single transistors. Still further embodiments include improved heat dissipation across a plurality of transistors.

30 Claims, 37 Drawing Sheets

Collector Contact

Base Pedestal

Base Contact

Emitter

Emitter Contact

First Dielectric Layer

First Metal Layer

Second Dielectric Layer

Second Metal Layer

Third Dielectric Layer

First Dielectric Layer

First Metal Layer

Second Dielectric Layer

Second Metal Layer

Third Dielectric Layer

First Metal Layer

Second Dielectric layer

Second Metal Layer

Third Dielectric Layer

TRANSISTOR LAYOUT HAVING A HEAT DISSIPATIVE EMITTER

CROSS-REFERENCE TO RELATED APPLICATIONS

This application is a continuation-in-part of U.S. utility application entitled, "A TRANSISTOR HAVING A NOVEL LAYOUT AND AN EMITTER HAVING MORE THAN ONE FEED POINT," having Ser. No. 09/126,301, filed on Jul. 30, 1998, now U.S. Pat. No. 6,236,071 which is entirely incorporated herein by reference.

This application is also related to copending U.S. utility patent application entitled "A TRANSISTOR HAVING A NOVEL LAYOUT AND AN EMITTER HAVING MORE THAN ONE FEED POINT," having Ser. No. 09/687,381, filed on Oct. 13, 2000, which is entirely incorporated herein by reference.

BACKGROUND OF THE INVENTION

1. Field of the Invention

This invention relates to transistors, and particularly to transistors having a novel layout resulting in improved electrical and heat dissipation characteristics.

2. Related Art

Transistors have become a common component in modern electrical equipment. One application in which transistors play a vital role is in cellular telephone transmitters and other communication devices. Cellular telephone transmitters send signals from the cellular telephone to a base station. The transmitters use amplifiers to send the signals and the amplifiers include transistors.

Cellular phones process signals prior to and during transmission. The signals may be generated by a voice speaking into a microphone. Cellular phones process the signals at very low currents because low current signals are more efficient to process and allow for longer battery life. However, low current signals must be amplified to high current signals prior to being sent from the cellular telephone to the base station. Transistors perform this current amplification function. One type of transistor that is often used in cellular telephones is a heterojunction bipolar transistor (HBT).

There is a constant need in the industry to create smaller and more efficient transistors with better electrical characteristics. The area occupied by transistors in an amplifier is a significant portion of the total die area of the amplifier. Reducing the transistor die area can substantially reduce the total die area occupied by the amplifier. A reduction of the total die area reduces the cost to manufacture the amplifier. Reducing the die area also allows for increased integration (i.e., an increase in the number of circuit elements that can be integrated into a circuit design). Increased integration allows for smaller cellular phones and cellular phones with greater features.

However, the ability to reduce the transistor die area is hindered by heat dissipation concerns. Heat dissipation is related to the power density of the transistor. Transistors include three main components: a base, an emitter, and a collector. Heat tends to build up under the emitter portion of the transistor. Heat build up is increased as cellular telephone transistors migrate to lower voltages. As the voltage of the cellular telephone system decreases, designers are forced to make transistors larger to accommodate a fixed power requirement (i.e., P=VI, where P is the power, V is the voltage, and I is the current). If V decreases, such as in a low operating voltage environment, then the current I must increase to keep P constant. To prevent heat from building up, an increase in I is accomplished through a larger transistor area and, in particular, a larger emitter area. Therefore, conventional power transistors designed for low voltage systems, such as cellular phones, have layouts with large area requirements in order to handle the high current levels.

One of the primary electrical problems associated with transistors is a susceptibility to emitter failure. In conventional transistors the current density in the emitters is uneven. Generally, there is a higher current density near the input of the emitter and a lower current density away from the input of the emitter. Since a high current density exposes the input area of the emitter to high temperatures (i.e. hot spots) the transistor is susceptible to failure due to emitter burnout.

Another electrical problem associated with transistors is impairment due to high base-to-collector capacitance. High base-to-collector capacitance is associated with the layout of the transistor. For example, base-to-collector capacitance is increased if there is close proximity between the collector and the base. In such layouts, the base and collector become capacitively coupled causing feedback between the collector and base. Furthermore, since the base-to-collector capacitance is proportional to the portions of the base and collector that overlap, large base and collector areas of conventional power transistors increase the base-to-collector capacitance, thereby decreasing performance. High base-to-collector capacitance reduces the current gain of the transistor, leads to radio frequency instability, and leads to problems with signal linearity.

A third electrical problem associated with transistors is a high collector-to-emitter resistance. The high collector-to-emitter resistance problem is also associated with the layout of conventional transistors. High collector-to-emitter resistance causes power loss and power dissipation.

Accordingly, there is a need for a transistor that occupies less area, is suitable for low operating voltages, dissipates heat efficiently, and reduces electrical problems, while maintaining performance and reliability of the transistor.

SUMMARY

The invention provides a novel layout for a transistor. The novel layout results in better electrical and heat dissipation characteristics.

Briefly described, in architecture, one embodiment of the novel layout for a transistor, among others, includes an open circular emitter, a collector, a collector contact, and a base pedestal. The open circular emitter has an external border. The collector includes a collector layer portion. The collector contact has an interior border contoured to the emitter exterior border. The collector layer portion has an exterior border contoured to the emitter exterior border. Further, the base pedestal has an exterior border contoured to the emitter exterior border. The transistor may further include a base contact disposed in an emitter void. The base contact may have an exterior border contoured to an emitter interior border. Another embodiment includes emitters of various shapes with other transistor components contoured to the external borders of the various shaped emitters.

Another embodiment includes a transistor with an emitter ballast resistor and wider leg portions and a key-shaped fill portion for additional heat shunting capabilities. Another embodiment omits the emitter ballast resistor and includes additional heat shunting capabilities through an emitter terminal portion of a second metal layer. Still further embodiments include additional heat shunting across a plurality of transistors.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
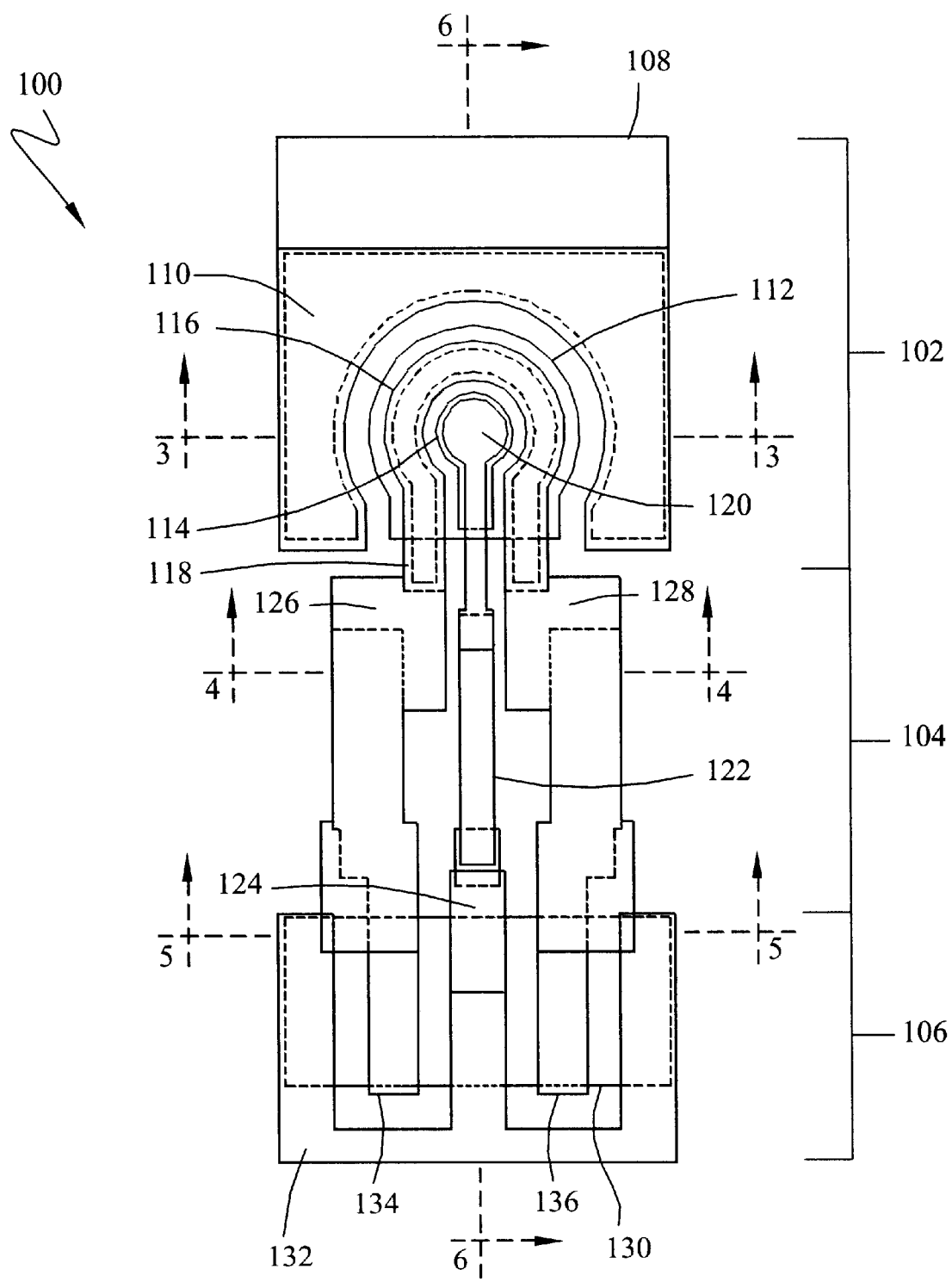
FIG. 1 is a plan view of an embodiment of the transistor layout including an intrinsic section, a second section, and a third section.

FIG. 1 is a plan view of an embodiment of the transistor layout. FIG. 1 shows a transistor 100 including an intrinsic section 102, a second section 104, and a third section 106. The intrinsic section 102 includes a collector terminal portion 108 of a second metal layer 1000 (FIG. 10), a collector contact 110, a base pedestal 112, a base contact 114, an emitter 116, and an emitter contact 118. Intrinsic section 102 is further described in FIG. 3. The emitter 116 and the emitter contact 118 extend into the second section 104.

The second section 104 includes a base ballast resistor 122, a base terminal portion 124 of the second metal layer 1000 (FIG. 10), a first leg portion 126 of the second metal layer 1000, and a second leg portion 128 of the second metal layer 1000. Second section 104 is further described in FIG. 4. The base terminal portion 124, the first leg portion 126, and the second leg portion 128, of the second metal layer 1000 extend into the third section 106 of the transistor 100.

Figure 9:
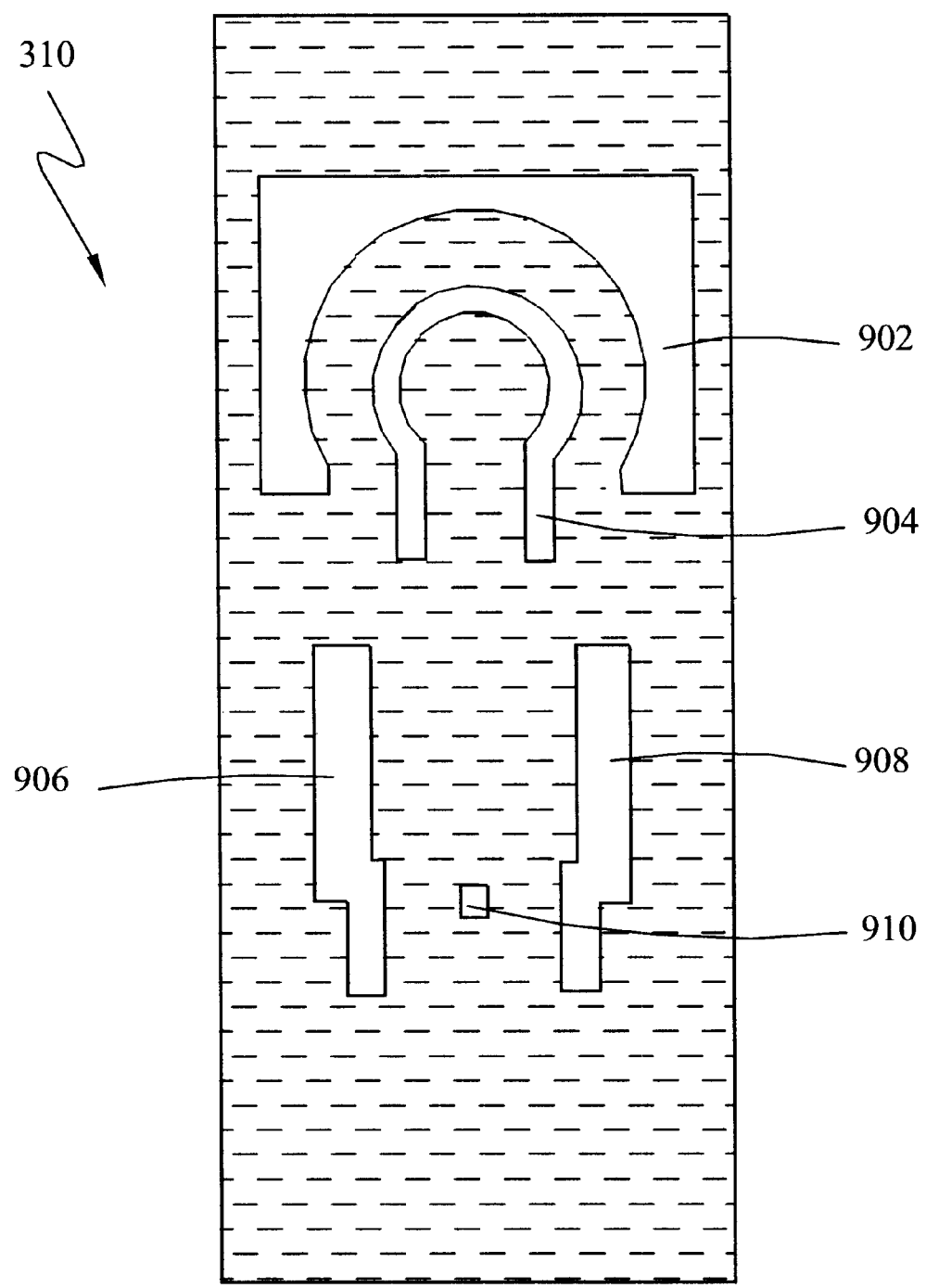
FIG. 9 is a plan view of the second dielectric layer of the transistor of FIG. 1.

The base ballast resistor 122 is formed from a base ballast resistive material. The base ballast resistive material may be tantalum nitride, nickel chromium, multiple semiconductor layers, or other resistive materials known to those of ordinary skill in the art. The base ballast resistor 122 maintains radio frequency (RF) stability in the transistor 100 and allows for gain control. Although the resistance value of base ballast resistor 122 may vary depending upon the application, the resistance is generally a few hundred ohms. The base ballast resistor 122 is disposed between a first dielectric layer 302 (FIG. 7) and a second dielectric layer 310 (FIG. 9). The resistance varies with the thickness and the properties of the base ballast resistive material. The base ballast resistive material may have a thickness in the range of 1000 Angstroms.

Third section 106 includes an emitter ballast resistor 130, an emitter terminal portion 132 of a first metal layer 800 (FIG. 8), a first leg portion 134 of the first metal layer 800, and a second leg portion 136 of the first metal layer 800. The first leg portion 134 and the second leg portion 136 of the first metal layer 800 extend into the second section 104 of the transistor 100. Third section 106 is further described in FIG. 5.

The emitter ballast resistor 130 is formed from an emitter ballast resistive material. The emitter ballast resistive material may be tantalum nitride, nickel chromium, multiple semiconductor layers, or other resistive materials known to those having ordinary skill in the art. The emitter ballast resistor 130 ensures a controlled distribution of current within the transistor 100 by providing feedback to the transistor 100. The emitter ballast resistor 130 is generally used for applications involving higher voltage levels (e.g. 5V to 10V). As with the base ballast resistor material, the resistance value of the emitter ballast resistor 130 material may vary depending upon the application, however, the resistance of the emitter ballast resistor 130 material is generally less than 5 ohms. The resistance varies with the thickness and the properties of the emitter ballast resistive material. The emitter ballast resistive material may have a thickness in the range of 1000 to 2000 Angstroms or less. Electrical contacts may be formed on the emitter ballast resistive material.

Figure 2:
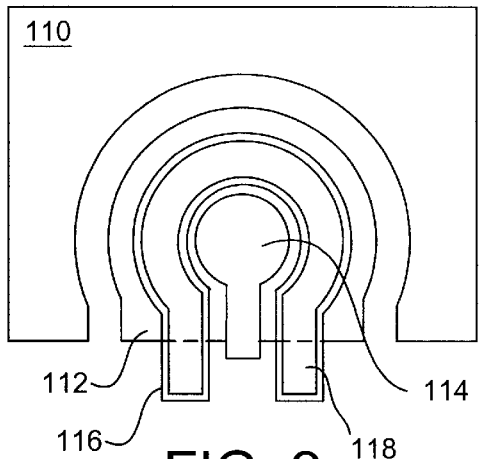
FIG. 2 is a plan view of the intrinsic section of the transistor of FIG. 1 including a collector contact, a base pedestal, a base contact, an emitter, and an emitter contact.

FIG. 2 is a plan view of the collector contact 110, the base pedestal 112, the base contact 114, the emitter 116, and the emitter contact 118, of the intrinsic section 102 of the transistor 100 of FIG. 1.

Figure 2A:
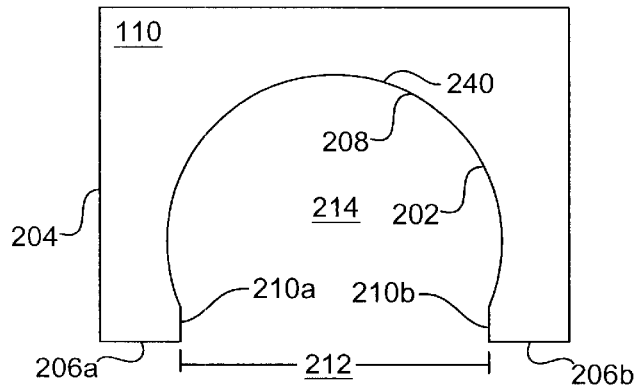
FIGS. 2A to 2E are plan views of the components of FIG. 2 shown in isolation.

FIG. 2A is a plan view of the collector contact 110 of FIGS. 1 and 2. The collector contact 110 has an interior border 202, an exterior border 204, a first portion 206a of an endpoint border, and a second portion 206b of the endpoint border. The collector contact interior border 202 includes a generally circular portion 208, a first straight portion 210a, and a second straight portion 210b. A collector contact gap 212 is defined by the separation between the first straight portion 210a and the second straight portion 210b. A collector contact center void 214 is defined by the generally circular portion 208. The collector contact 110 may be a metal composite of gold-germanium (AuGe), nickel, gold, or other materials known to those having ordinary skill in the art, and may have a thickness in the range of 1000 to 3000 Angstroms.

Figure 2B:
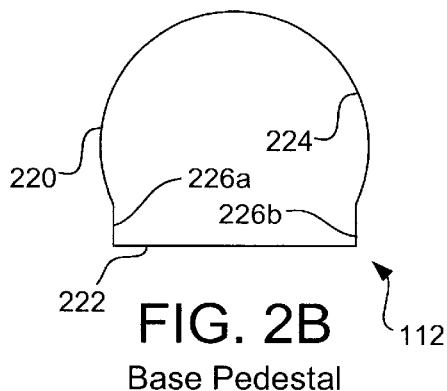

FIG. 2B is a plan view of the base pedestal 112 of FIGS. 1 and 2. Base pedestal 112 includes an exterior border 220 and a bottom border 222. The exterior border 220 includes a generally circular portion 224, a first straight portion 226a, and a second straight portion 226b. Base pedestal 112 may have a thickness in the range of 1000 to 5000 Angstroms.

The exterior border 220 of the base pedestal 112 follows the contour of the interior border 202 of the collector contact 110. The exterior border 220 of the base pedestal is thus contoured to the interior border 202 of the collector contact 110. "Contoured to" in the context of the exterior border 220 and the interior border 202 refers to the exterior border 220 having the same general shape as the interior border 202 and points along the exterior border 220 are generally equidistant from the interior border 202. Also, the exterior border 220 is "shorter than" the interior border 202. "Shorter than" in the context of the exterior border 220 and the interior border 202 refers to the total length of the exterior border 220 being less than the total length of the interior border 202.

The configuration of the base pedestal 112 and the collector contact 110 shown in FIGS. 1 and 2 results in a low base-to-collector capacitance. A low base-to-collector capacitance increases radio frequency (RF) stability, increases signal linearity, and increases current gain in the transistor 100.

Figure 2C:
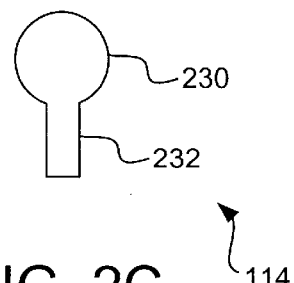
Figure 8:
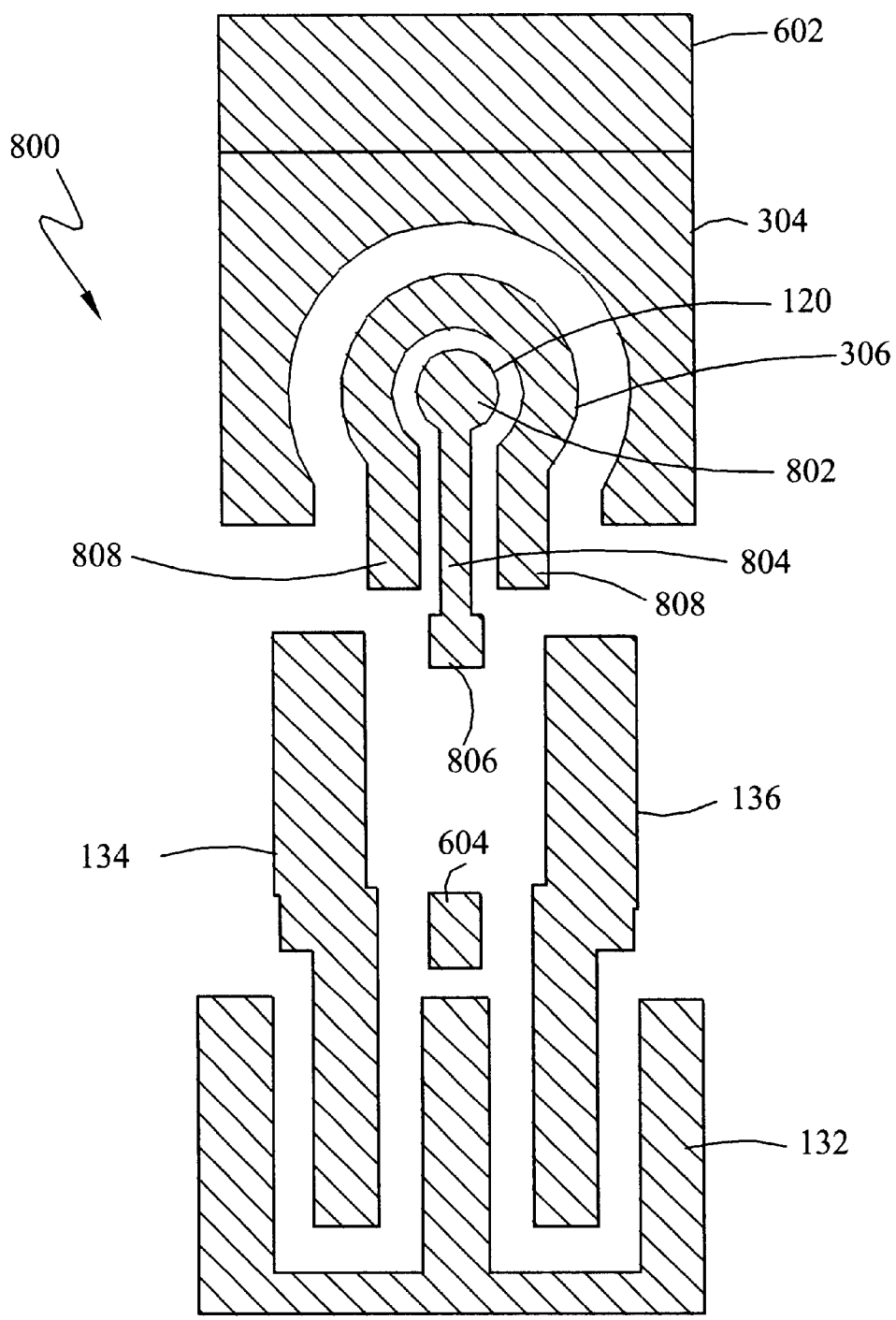
FIG. 8 is a plan view of the first metal layer of the transistor of FIG. 1.

FIG. 2C is a plan view of the base contact 114 of FIGS. 1 and 2. The base contact 114 includes a circular portion 230 and a rectangular portion 232. Base contact 114 provides an electrical connection between the base pedestal and a base contact portion 120 of the first metal layer 800 (FIG. 8). Base contact 114 may be a metal composite of titanium, platinum and gold, and may have a thickness in the range of 1000 to 2000 Angstroms.

Figure 2D:
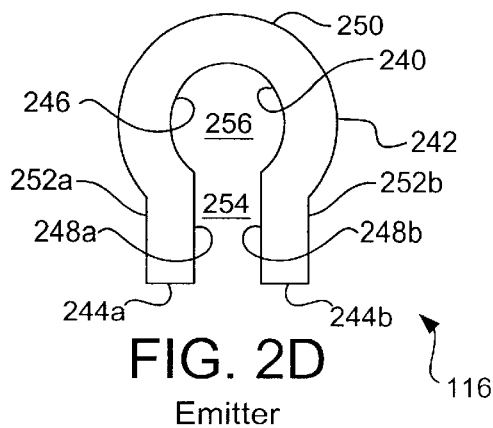

FIG. 2D is a plan view of the emitter 116 of FIGS. 1 and 2. Emitter 116 includes an interior border 240, an exterior border 242, a first portion 244a of an endpoint border, and a second portion 244b of the endpoint border. Interior border 240 includes a generally circular portion 246, a first straight portion 248a and a second straight portion 248b. Emitter exterior border 242 includes a generally circular portion 250, a first straight portion 252a, and a second straight portion 252b. The perimeter of the generally circular portion 250 makes up approximately 75% of the emitter exterior border 242. The first straight portion 248a of the emitter interior border 240 and the second straight portion 248b of the emitter interior border 240 define an emitter gap 254. The generally circular portion 246 of the emitter interior border 240 defines an emitter center void 256. The emitter 116 may have a thickness in the range of 1000 to 3000 Angstroms.

The interior border 202 of the collector contact 110 follows the contour of the exterior border 242 of the emitter 116. The interior border 202 of the collector contact has the same general shape as the exterior border 242 of the emitter 116 and the points along the interior border 202 of the collector contact 110 are generally equidistant from the exterior border 242 of the emitter 116. The collector contact 110 and emitter 116 configuration shown in FIGS. 1 and 2 allows current to flow between the collector contact 110 and the emitter 116 in a direction that is generally normal (when viewed from the top) to the interior border 202 of the collector contact 110.

The configuration of the collector contact 110 and emitter 116 shown in FIGS. 1 and 2 results in low resistance between the collector contact 110 and the emitter 116. The low resistance between the collector contact 110 and the emitter 116 reduces power loss and current dissipation in the transistor 100.

The base contact 114 is disposed within the emitter center void 256 and the emitter center gap 254. By disposing the base contact in the emitter center void 256 and the emitter gap 254, the emitter 116 partially isolates the base contact 114 from the collector contact 110. Isolating the base contact 114 from the collector contact 110 decreases the base-to-collector capacitance. As noted above, a low base-to-collector capacitance increases radio frequency (RF) stability, increases signal linearity, and increases current gain in the transistor 100.

The base contact 114 and emitter 116 configuration shown in FIGS. 1 and 2 allows current to flow between the base contact 114 and the emitter 116 in a direction that is generally normal (when viewed from the top) to the interior border 202 of the emitter 116.

Emitter 116 has two feed points in the general area of the first portion 244a of the emitter endpoint and the second portion 244b of the emitter endpoint. A feed point is an area of the emitter 116 where current flows between the intrinsic section 102 of the transistor 100 and the second section 104 of the transistor 100. Generally the emitter current $I_E$ (see FIG. 12) passes through the emitter contact 118. An emitter, such as emitter 116, having more than one feed point reduces hotspots in the emitter.

Figure 2E:
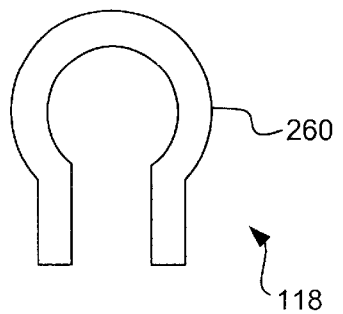

FIG. 2E is a plan view of the emitter contact 118 of FIGS. 1 and 2. The emitter contact 118 includes a border 260. The border 260 of the emitter contact is defined by the emitter 116 interior border 240, the emitter exterior border 242, the first portion 244a of the emitter endpoint border, and the second portion 244b of the emitter endpoint border. The emitter contact 118 is disposed on the emitter 116. The emitter contact 118 is the same shape as the emitter 116, however, the emitter contact 118 is slightly smaller than the emitter 116. The emitter contact 118 provides an electrical connection between the emitter 116 and an emitter contact portion 306 (FIGS. 3 and 8) of the first metal layer 800 (FIG. 8). The emitter contact 118 may be a metal composite of gold-germanium (AuGe), nickel, gold, or other materials known to those having ordinary skill in the art, and may have a thickness in the range of 1000 to 3000 Angstroms.

Figure 3:
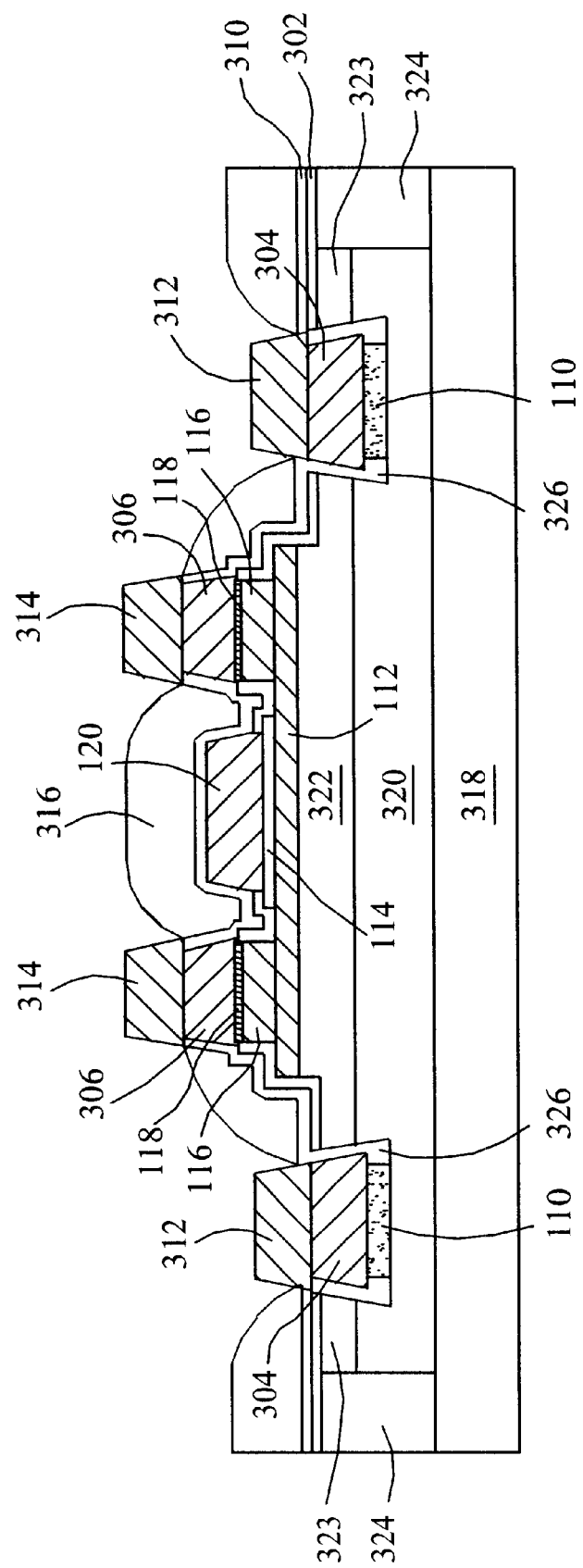
FIG. 3 is a cross-sectional view of the intrinsic section of the transistor of FIG. 1.

FIG. 3 is a cross-sectional view of the intrinsic section 102 of the transistor 100 of FIG. 1 through section line 3 of FIG. 1. FIG. 3 shows the collector contact 110, the base pedestal 112, the base contact 114, the emitter 116, and the emitter contact 118 of FIGS. 1 and 2. FIG. 3 also shows a first dielectric layer 302, a collector contact portion 304 of the first metal layer 800 (FIG. 8), an emitter contact portion 306 of the first metal layer 800, a base contact portion 120 of the first metal layer 800, a second dielectric layer 310, a collector contact portion 312 of a second metal layer 1000 (FIG. 10), an emitter contact portion 314 of the second metal layer 1000, and a third dielectric layer 316. FIG. 3 further shows a substrate layer 318, a subcollector layer 320 disposed on the substrate layer 318, a collector layer center portion 322 disposed on the subcollector layer 320, and a collector layer exterior portion 323 disposed on the subcollector layer 320. The collector layer includes the collector layer center portion 322 and the collector layer exterior portion 323. The collector contact 110 is disposed in a trench 326 etched into the collector layer and the subcollector layer 320.

FIG. 3 also shows an active region and an inactive region 324. The active region includes the subcollector layer 320, the collector layer, the base pedestal 112, and the emitter 116. The active layers may be 2 to 4 microns thick. The subcollector layer 320 may have a thickness greater than 5000 Angstroms. The collector layer may have a thickness between 5000 and 15000 Angstroms.

The inactive region 324 includes the substrate layer 318 and other regions rendered inactive by processing steps. The substrate layer 318 has a high resistivity (i.e. non-active, non-conductive, and insulative). Substrate layer 318 may be gallium arsenide (GaAs), Silicon (Si), gallium nitride (GaN), Indium Phosphide (InP), or any other common substrate material known to those having ordinary skill in the art. Passive components, such as resistors, capacitors, and inductors, may be disposed on the inactive substrate layer 318. During the manufacture of transistor 100, active regions are protected from ion implantation and inactive regions 324 are exposed to ion implantation. Exposure to ion implantation removes semiconductor action properties from the inactive regions 324.

In operation, current flows between various components of the transistor 100. For example, current flows between the collector contact 110 and the emitter 116, and between the base contact 114 and the emitter 116. As shown in FIG. 3, current flowing between the collector contact 110 and the emitter 116 has a horizontal flow component (as viewed in FIG. 3) and a vertical component (also as viewed in FIG. 3). As used in herein, the descriptions of current flow apply to the horizontal component of the current flow (as viewed in FIG. 3). For example, earlier it was noted that the collector contact 110 and emitter 116 configuration shown in FIGS. 1 and 2 allows current to flow between the collector contact 110 and the emitter 116 in a direction that is generally normal (when viewed from the top) to the interior border 202 of the collector contact 110. The current flow that is generally normal (when viewed from the top) refers to the horizontal component of the current flow from the perspective of FIG. 3.

Figure 4:
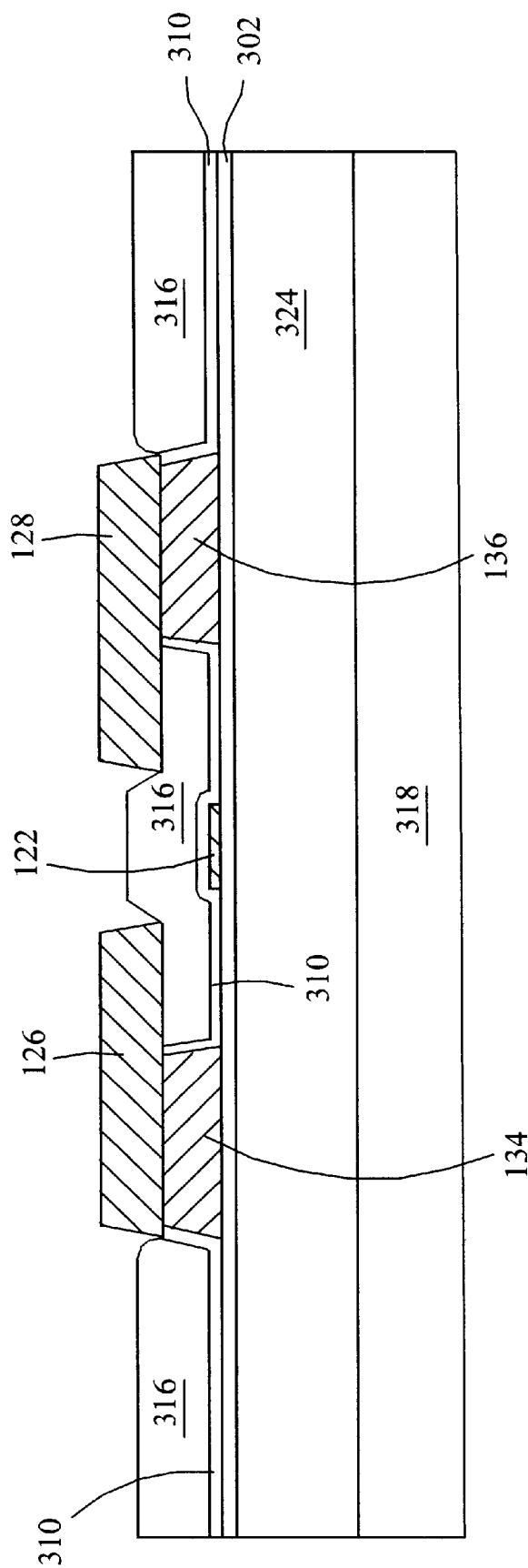
FIG. 4 is a cross-sectional view of the second section of the transistor of FIG. 1.

FIG. 4 is a cross-sectional view of the second section 104 of the transistor 100 of FIG. 1 through section line 4 of FIG. 1. FIG. 4 shows the base ballast resistor 122, the first leg portion 126 of the second metal layer 1000 (FIG. 10), the second leg portion 128 of the second metal layer 1000, the first leg portion 134 of the first metal layer 800 (FIG. 8), and the second leg portion 136 of the first metal layer 800. FIG. 3 also shows the first dielectric layer 302, the second dielectric layer 310, the third dielectric layer 316, and the inactive region 324.

Figure 5:
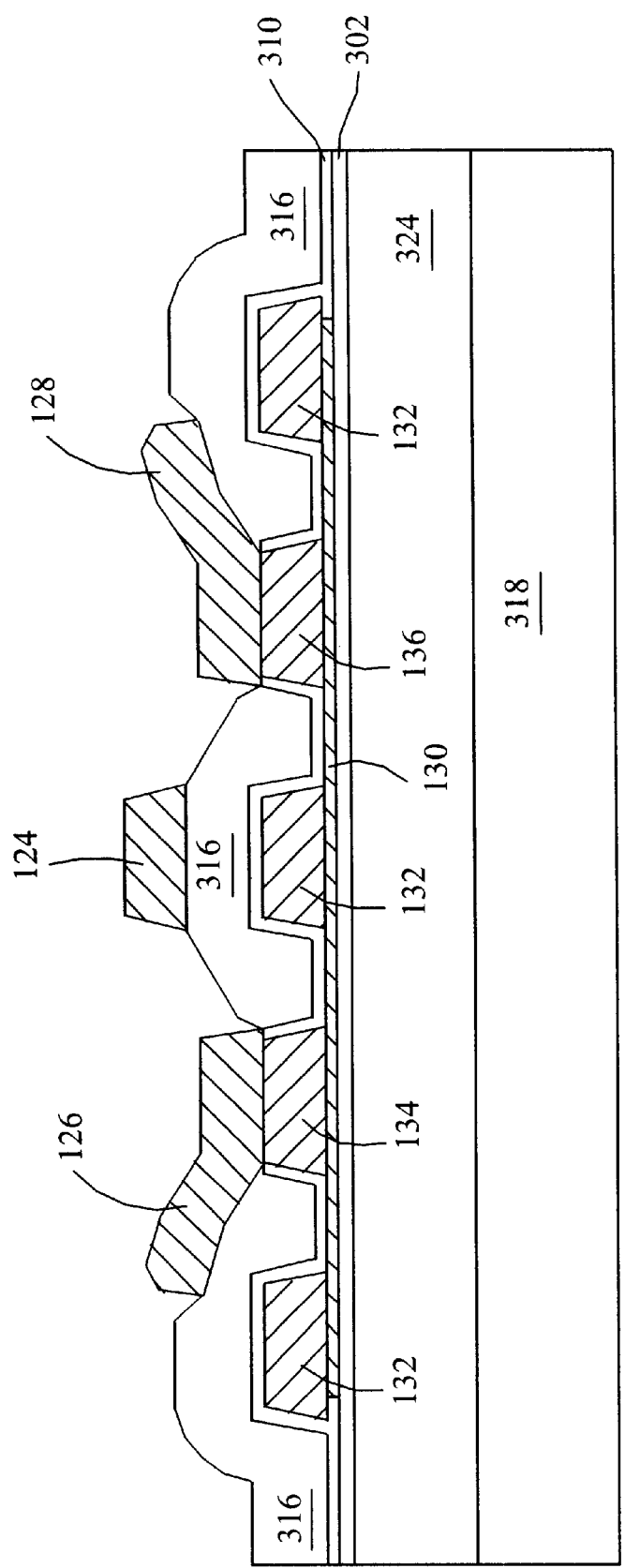
FIG. 5 is a cross-sectional view of the third section of the transistor of FIG. 1.

FIG. 5 is a cross-sectional view of the third section 106 of the transistor 100 of FIG. 1 through section line 5 of FIG. 1. FIG. 5 shows the base terminal portion 124 of the second metal layer 1000 (FIG. 10), and the emitter terminal portion 132 of the first metal layer 800 (FIG. 8). FIG. 5 also shows the first dielectric layer 302, the second dielectric layer 310, the third dielectric layer 316, the substrate layer 318, and the inactive region 324. FIG. 5 further shows the first leg portion 126 of the second metal layer 1000, the second leg portion 128 of the second metal layer 1000, the first leg portion 134 of the first metal layer 800, and the second leg portion 136 of the first metal layer 800.

Figure 6:
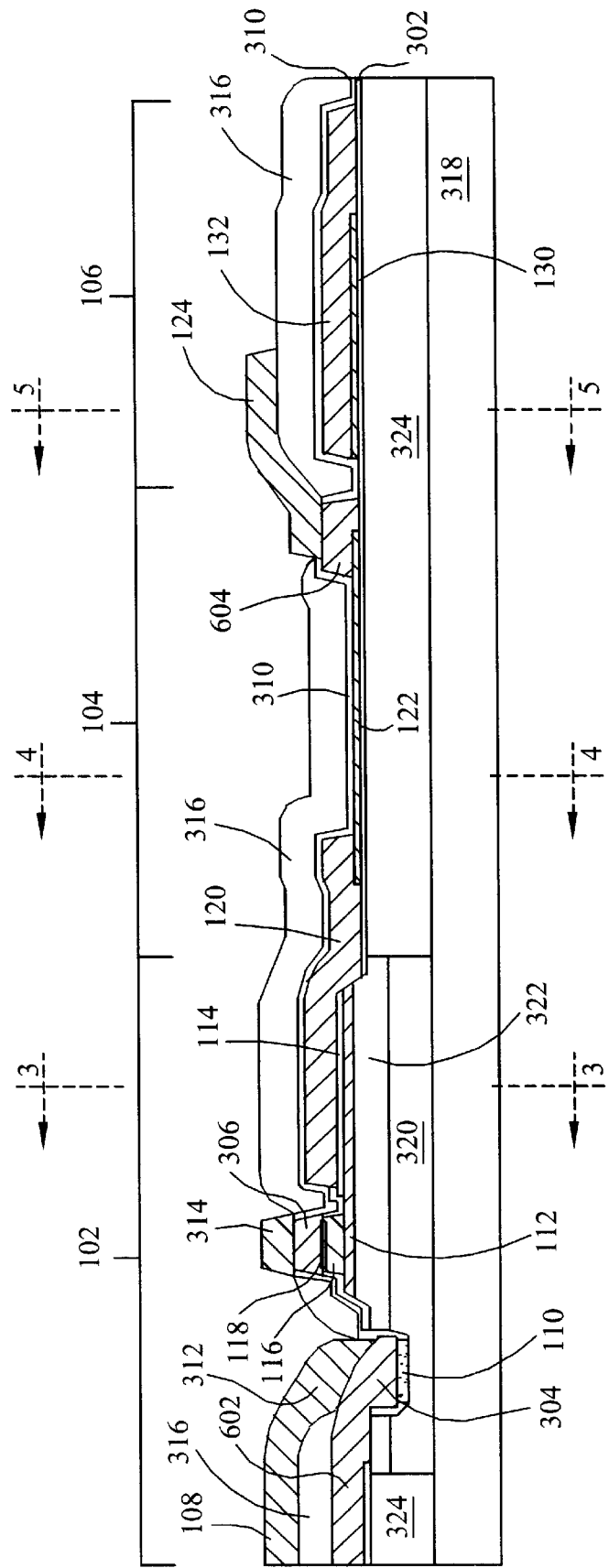
FIG. 6 is a cross-sectional view of the transistor of FIG. 1 through the intrinsic section, the second section, and the third section.

FIG. 6 is a cross-sectional view of the intrinsic section 102, the second section 104, and the third section 106 of the transistor 100 of FIG. 1 through section line 6 of FIG. 1. FIG. 6 shows the collector terminal portion 108 of the second metal layer 1000 (FIG. 10), the collector contact 110, the base pedestal 112, the base contact 114, the emitter 116, the emitter contact 118, the base ballast resistor 122, the base terminal portion 124 of the second metal layer 1000, the emitter ballast resistor 130, and the emitter terminal portion 132 of the first metal layer 800 (FIG. 8).

FIG. 6 also shows the first dielectric layer 302, the collector contact portion 304 of the first metal layer 800 (FIG. 8), the emitter contact portion 306 of the first metal layer 800, the base contact portion 120 of the first metal layer 800, the second dielectric layer 310, the collector contact portion 312 of the second metal layer 1000 (FIG. 10), the emitter contact portion 314 of the second metal layer 1000, the third dielectric layer 316, the substrate layer 318, the subcollector layer 320, the collector layer center portion 322, and inactive region 324.

In addition, FIG. 6 shows a collector terminal portion 602 of the first metal layer 800 (FIG. 8), and a base terminal portion 604 of the first metal layer 800. A passivation layer (not shown) may be disposed over the transistor 100 to provide scratch and moisture protection. The passivation layer may be made from silicon nitride ($Si_3N_4$) or other materials known to those of ordinary skill in the art.

Figure 7:
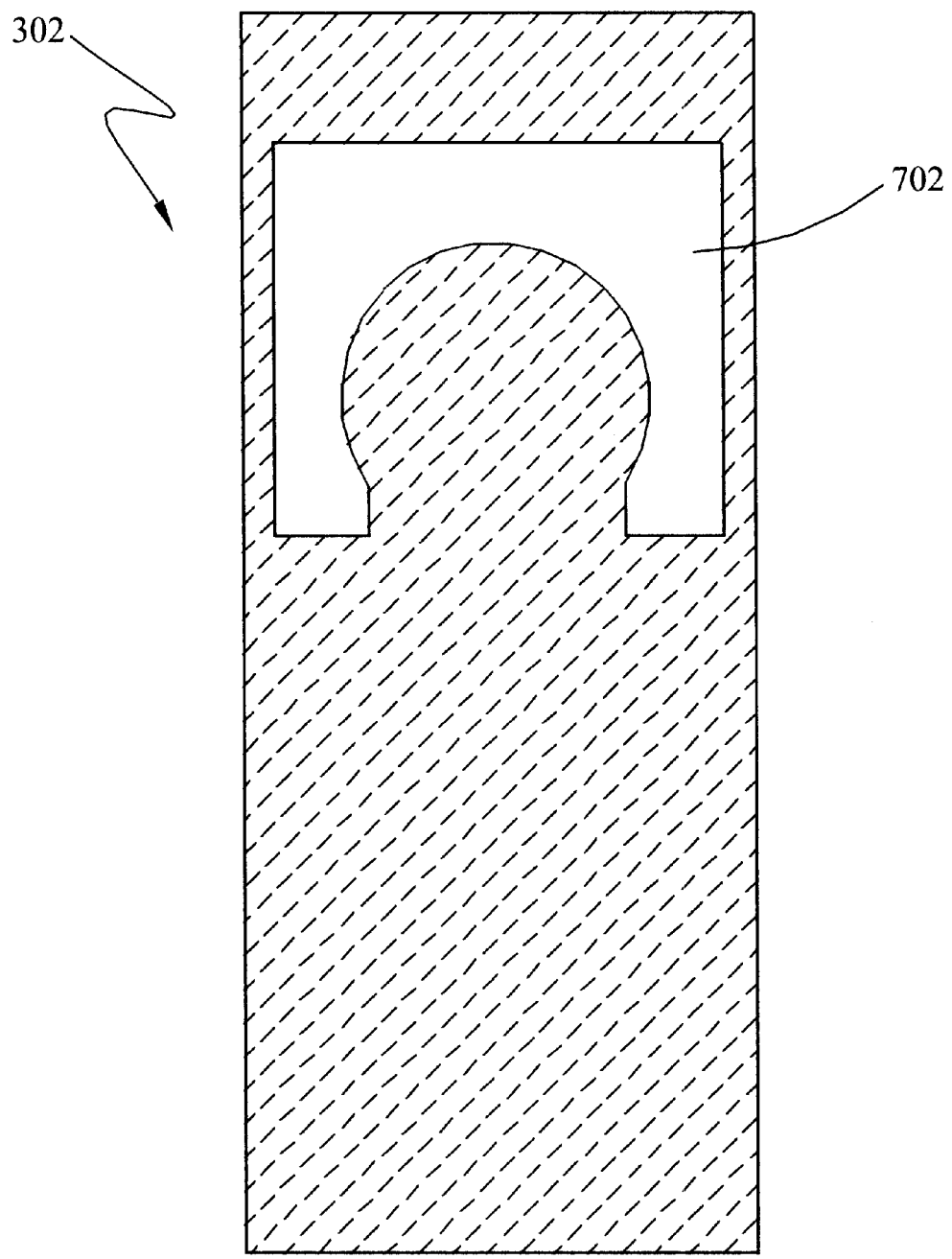
FIG. 7 is a plan view of the first dielectric layer of the transistor of FIG. 1.

FIG. 7 is a plan view of the first dielectric layer 302 of the transistor 100 of FIG. 1. The first dielectric layer 302 includes a first dielectric layer window 702. The first dielectric layer 302 generally separates various components of transistor 100 to prevent electrical interaction between the components, and between the components and the inactive region 324. The first dielectric layer window 702 allows electrical contact between the collector contact portion 304 of the first metal layer 800 and the collector contact 110. First dielectric layer 302 isolates the inactive region 324 from the first metal layer 800, the base ballast resistor 122, and the emitter ballast resistor 130. First dielectric layer 302 may be between 800 and 2000 Angstroms thick and may be made from an insulative material, such as silicon dioxide ($SiO_2$), silicon nitride ($Si_3N_4$), or other insulative materials known to those of ordinary skill in the art.

FIG. 8 is a plan view of the first metal layer 800 of transistor 100. The first metal layer 800 includes the base contact portion 120, the emitter terminal portion 132, the first leg portion 134, the second leg portion 136, the collector contact portion 304, the emitter contact portion 306, the collector terminal portion 602, and the base terminal portion 604. The base contact portion 120 includes a generally circular portion 802, a rectangular portion 804, and a contact pad portion 806. The emitter contact portion 306 includes a terminal portion 808. First metal layer 800 may have a thickness of approximately 0.5 to 2 microns and may be a metal composite of titanium, platinum, and gold.

The collector terminal portion 602 of the first metal layer 800 is in electrical contact and thermal contact with the collector contact portion 304. The collector contact portion 304 of the first metal layer 800 provides an electrical connection between the collector terminal portion 108 of the second metal layer 1000 (FIG. 10) and the collector contact 110.

Figure 10:
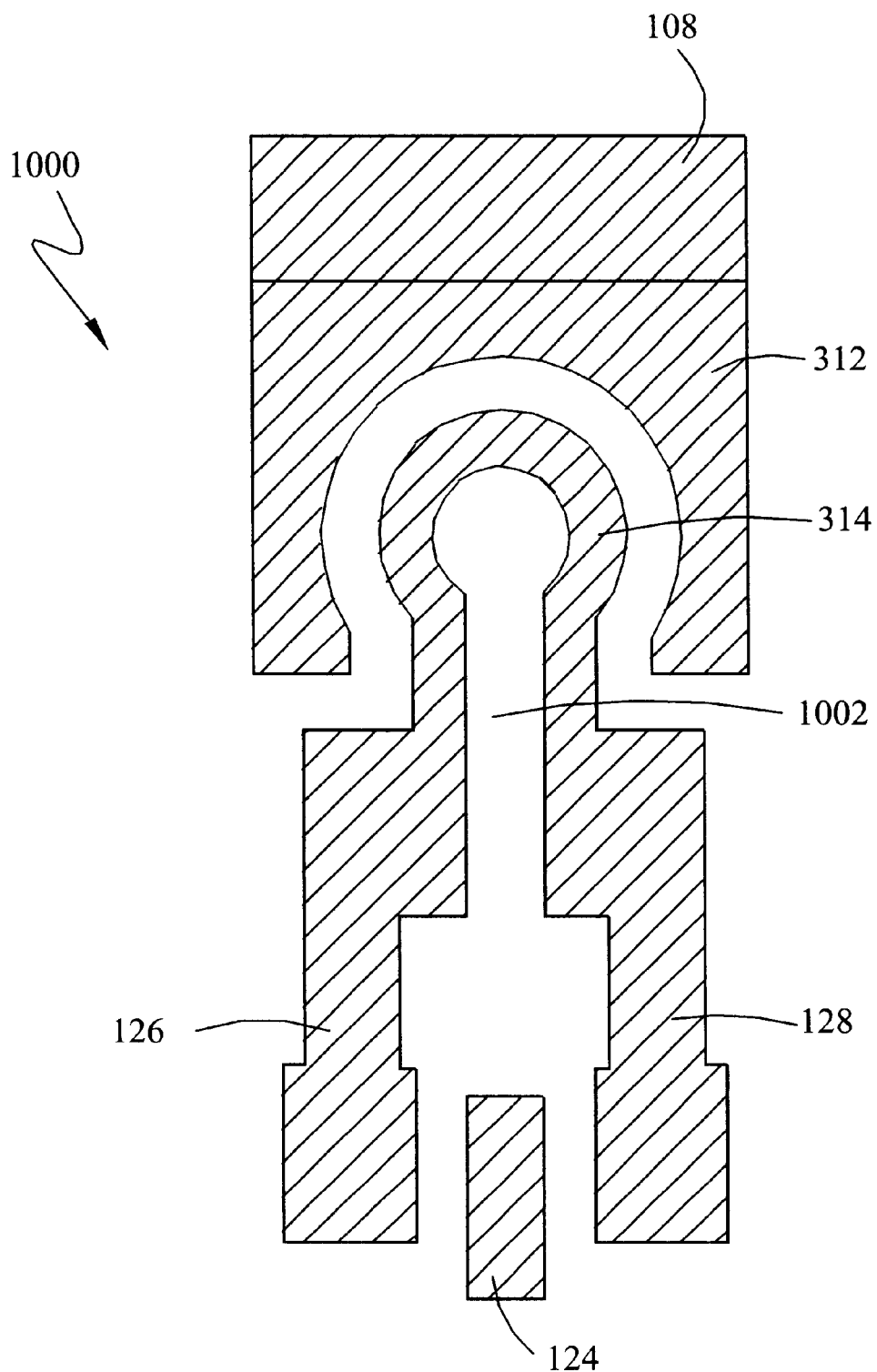
FIG. 10 is a plan view of the second metal layer of the transistor of FIG. 1.

The emitter contact portion 306 of the first metal layer 800 provides an electrical connection between the emitter contact 118 and the emitter contact portion 314 of the second metal layer 1000 (FIG. 10). The base contact portion 120 of the first metal layer 800 provides an electrical connection between the base contact 114 and the base ballast resistor 122.

The first leg portion 134 and the second leg portion 136 of the first metal layer 800, together with first leg portion 126 and second leg portion 128 of the second metal layer 1000, provide an electrical connection between the emitter contact portion 314 of the second metal layer 1000 and the emitter ballast resistor 130. The emitter terminal portion 132 is in electrical connection with the emitter ballast resistor 130. The base terminal portion 604 provides an electrical connection between the base ballast resistor 122 and the base terminal portion 124 of the second metal layer 1000.

FIG. 9 is a plan view of the second dielectric layer 310 of transistor 100. Second dielectric layer 310 includes a collector contact window 902, an emitter contact window 904, a first leg window 906, a second leg window 908, and a base terminal window 910. Collector contact window 902 allows for electrical contact between the collector contact portion 304 of the first metal layer 800, the collector contact portion 312 of the second metal layer 1000, and the collector contact 110. Emitter contact window 904 permits electrical contact between the emitter contact portion 306 of the first metal layer 800, the emitter contact portion 314 of the second metal layer 1000, and the emitter contact 118. Second dielectric layer 310 may be made from an insulative material, such as silicon dioxide ($SiO_2$), silicon nitride ($Si_3N_4$), or other insulative materials known to those of ordinary skill in the art.

First leg window 906 allows for electrical contact between the first leg portion 134 of the first metal layer 800, and the first leg portion 126 of the second metal layer 1000 (FIG. 10). Second leg window 908 allows for electrical contact between the second leg portion 136 of the first metal layer 800, and the second leg portion 128 of the second metal layer 1000. Base terminal window 910 allows for electrical contact between the base terminal portion 604 of the first metal layer 800, the base terminal 25 portion 124 of the second metal layer 1000, and the base ballast resistor 122.

FIG. 10 is a plan view of the second metal layer 1000 of transistor 100. The second metal layer 1000 includes the collector terminal portion 108, the base terminal portion 124, the first leg portion 126, the second leg portion 128, the collector contact portion 312, and the emitter contact portion 314. FIG. 10 also shows a key shaped void 1002. Second metal layer 1000 may have a thickness of approximately 1 to 6 microns and may be a metal composite of titanium, platinum, and gold.

Collector terminal portion 108 is in electrical and thermal contact with the collector contact portion 312. Collector contact portion 312 provides an electrical connection between collector terminal portion 108 and the collector contact portion 304 of the first metal layer 800. Emitter contact portion 314, first leg portion 126, and second leg portion 128, provide an electrical connection between the emitter contact portion 306 of the first metal layer 800, the first leg portion 134 of the first metal layer 800, and the second leg portion 136 of the first metal layer 800. Base terminal portion 124 is in electrical contact with the base terminal portion 604 of the first metal layer 800.

Figure 11:
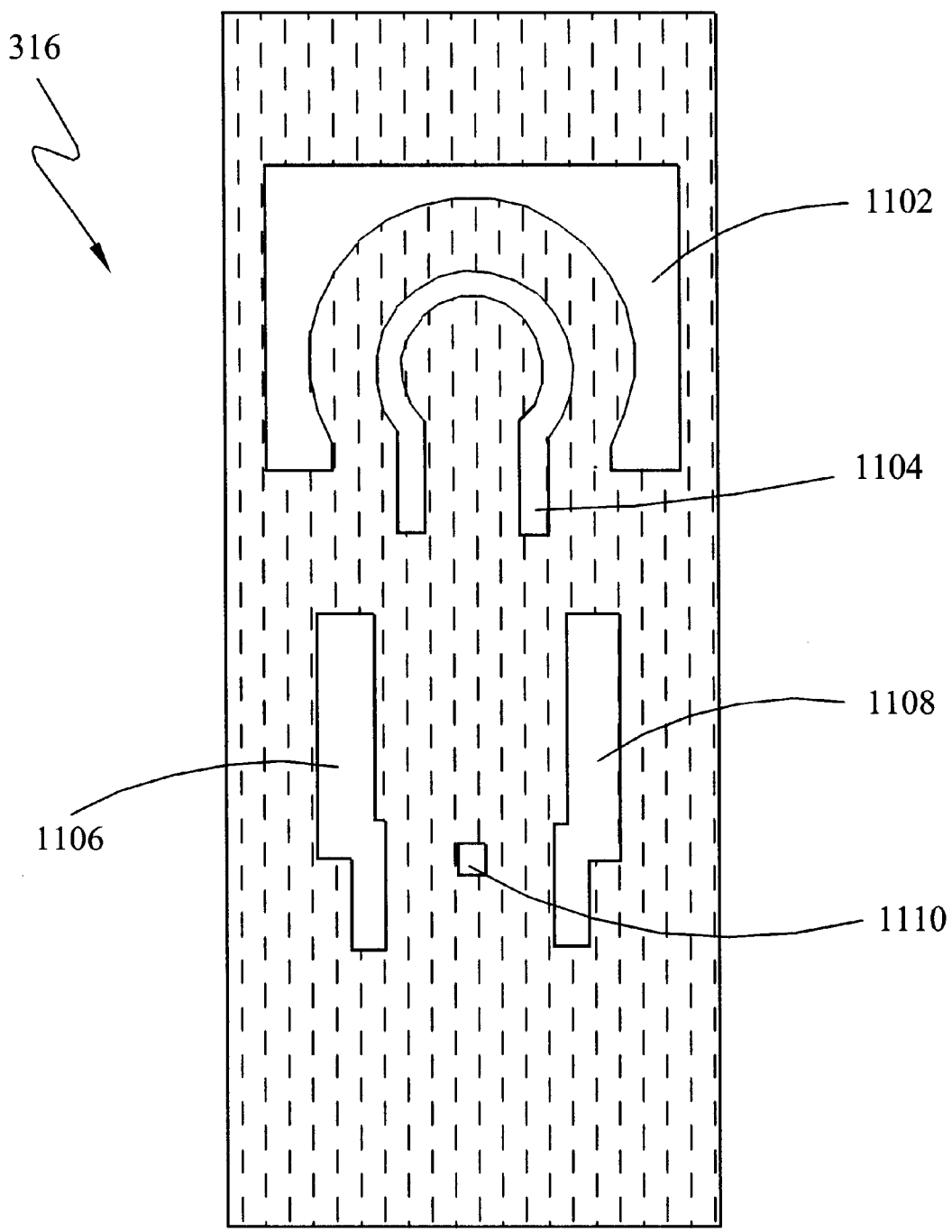
FIG. 11 is a plan view of the third dielectric layer of the transistor of FIG. 1.

FIG. 11 is a plan view of the third dielectric layer 316 of transistor 100. Third dielectric layer 316 includes a collector contact window 1102, an emitter contact window 1104, a first leg window 1106, a second leg window 1108, and a base terminal window 1110. The third dielectric layer 316 may be made from an insulative material, such as $SiO_2$, a polyimide material, or other insulative materials known to those of ordinary skill in the art. Third dielectric layer 316 may have a thickness in the range of 1 to 2 microns. Portions of third dielectric layer 316 are utilized as an insulative barrier between the first metal layer 800 and the second metal layer 1000. For example, FIGS. 5 and 6 show emitter terminal portion 132 of the first metal layer 800 separated from the base terminal portion 124 of the second metal layer 1000 by the third dielectric layer 316. FIG. 6 also shows the collector terminal portion 602 of the first metal layer 800 separated from the collector terminal portion 108 of the second metal layer 1000 by the third dielectric layer 316.

Collector contact window 1102 allows for electrical contact between the collector contact portion 304 of the first metal layer 800, the collector contact portion 312 of the second metal layer 1000, and the collector contact 110. Emitter contact window 1104 allows for electrical contact between the emitter contact portion 306 of the first metal layer 800, the emitter contact portion 314 of the second metal layer 1000, and the emitter contact 118.

First leg window 1106 allows for electrical contact between the first leg portion 134 of the first metal layer 800, and the first leg portion 126 of the second metal layer 1000. Second leg window 1108 allows for electrical contact between the second leg portion 136 of the first metal layer 800, and the second leg portion 128 of the second metal layer 1000. Base terminal window 1110 allows for electrical contact between the base terminal portion 604 of the first metal layer 800, the base terminal portion 124 of the second metal layer 1000, and the base ballast resistor 124.

Figure 12:
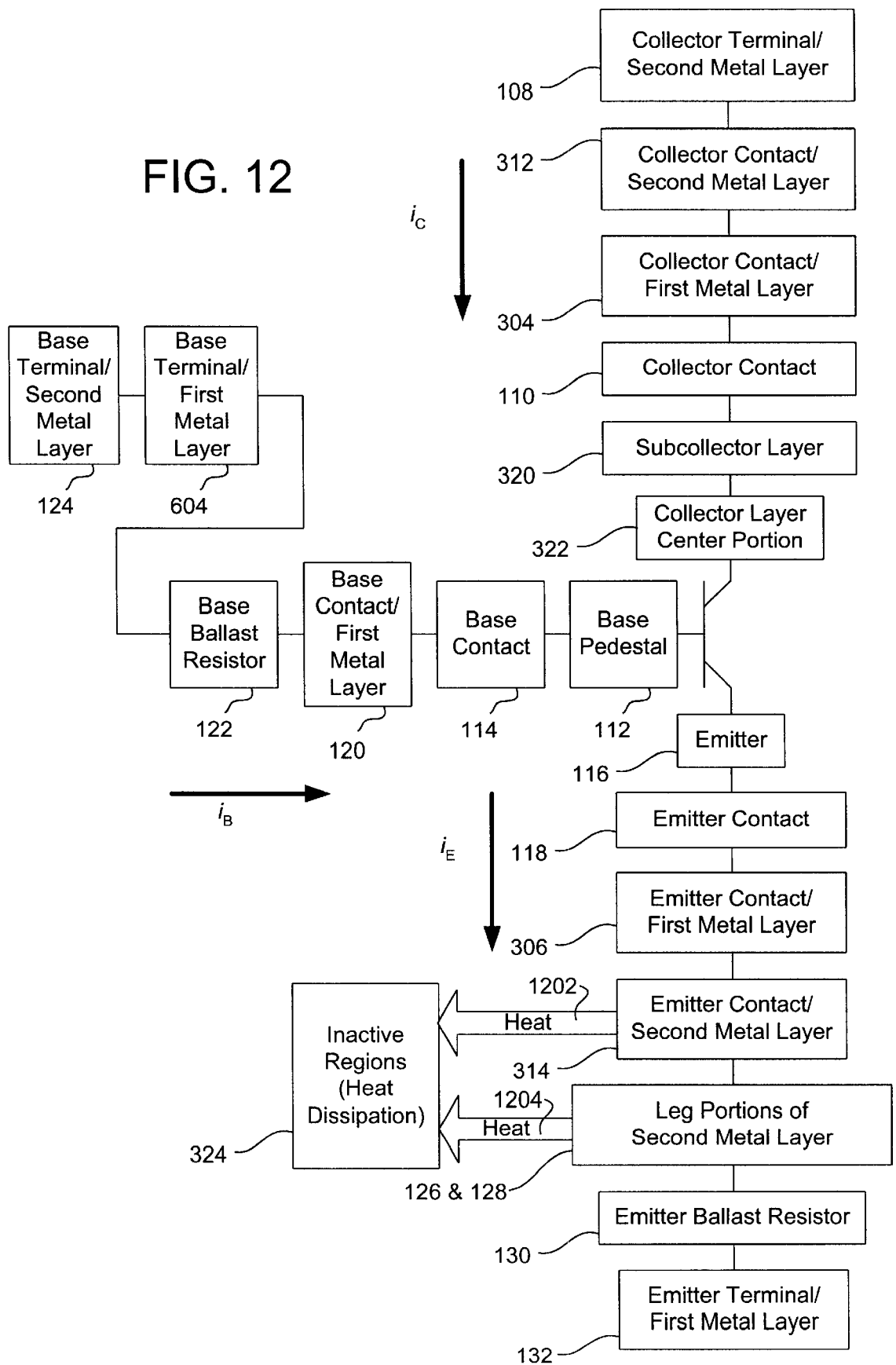
FIG. 12 is a block diagram illustrating the electrical and thermal interaction of the components included in the transistor of FIG. 1.

FIG. 12 is a block diagram illustrating the electrical and thermal interaction of the components of transistor 100. Transistor 100 may be an NPN type transistor used as a power transistor in a power amplifier of a cellular telephone. Generally, transistors may operate in common-emitter mode, common-base mode, or common-collector mode. The common-emitter mode may be used when the transistor is used as a power transistor in a cellular telephone. In common-emitter mode, the emitter terminal is coupled to ground and the base terminal receives an input signal. Transistors operating in common-emitter mode provide good gain and RF stability at lower frequencies. These characteristics are desirable in cellular telephone applications.

In the following description, "normal operation" is when the transistor 100 is an NPN transistor used as a power transistor operating in the common-emitter mode. Those having ordinary skill in the art will recognize that the transistor layout as claimed below does not depend upon what mode of operation the transistor is operating in, whether the transistor is an NPN or PNP transistor, or the particular application of the transistor. However, it is useful to assume transistor 100 is in "normal operation" in order to fully describe the invention.

During normal operation, the collector current $i_C$ generally runs from the collector terminal portion 108 (collector terminal/second metal layer) of the second metal layer 1000 to the base pedestal 112. The emitter current $i_E$ generally runs from the base pedestal 112 to the emitter terminal portion 132 (emitter terminal/first metal layer) of the first metal layer 800. And the base current $i_B$ generally runs from the base terminal portion 124 (base terminal/second metal layer) of the second metal layer 1000 to the base pedestal 112. The emitter current $i_E$ is the sum of the collector current $i_C$ and the base current $i_B$.

The collector contact 110 provides an electrical connection between the collector contact portion 304 (collector contact/first metal layer) of the first metal layer 800 and the subcollector layer 320. The collector contact 110 is disposed on the subcollector layer 320. The base contact 114 provides an electrical connection between the base contact portion 120 (base contact/first metal layer) of the first metal layer 800 and the base pedestal 112. The base contact 114 is disposed on the base pedestal 112. The emitter contact 118 provides an electrical connection between the emitter 116 and the emitter contact portion 306 (emitter contact/first metal layer) of the first metal layer 800. The emitter contact 118 is also disposed on the base pedestal 112.

FIG. 12 shows at least one path for the currents to flow between the components shown in FIG. 12 during normal operation. However, the currents may flow either directly between the components that are in contact, or the currents may flow through other components providing parallel current paths. For example, first leg portion 126 of the second metal layer 1000 and first leg portion 134 of the first metal layer 800 provide parallel paths for the emitter current $i_E$ flowing between the emitter contact portion 306 of the first metal layer 800 and the emitter ballast resistor 130.

In addition to the electrical paths described above, FIG. 12 shows a first heat path 1202 and a second heat path 1204. The ability to reduce the die area of transistors is hindered by heat dissipation concerns. Heat is related to the power density of the transistor. Though heat is generated throughout the current carrying components of transistor 100, heat tends to build up in the portions of the transistor 100 carrying the emitter current $i_E$. The first heat path 1202 and the second heat path 1204 allow for heat to be efficiently transferred from the portions of the transistor 100 carrying the emitter current $i_E$ to the inactive regions 324. First heat path 1202 allows for heat to be transferred from the emitter contact portion 314 of the second metal layer 1000 to the inactive region 324. Second heat path 1204 allows for heat to be transferred from the first leg portion 126 and the second leg portion 128 of the second metal layer 1000 to the inactive region 324.

FIGS. 13A to 13F are plan views of additional embodiments of the emitter 116. The corresponding shapes of other components, such as the collector contact, the base pedestal, and the base contact, may be determined by contouring portions of the other components to portions of the interior or exterior borders of the additional embodiments shown in FIGS. 13A to 13F.

Figure 13A:
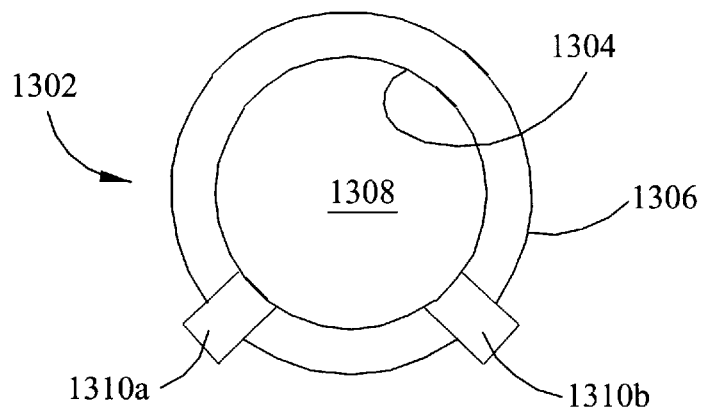
FIGS. 13A to 13F are plan views of additional embodiments of the emitter of FIG. 1.

FIG. 13A shows a circular emitter 1302 having a circular interior border 1304, a circular exterior border 1306, a circular center void 1308, a first feed point 1310a, and a second feed point 1310b. As a first example of determining the corresponding shapes for other components, the corresponding shape for a collector contact is a collector contact with an interior border contoured to a portion of the circular exterior border 1306. Such a collector contact is the collector contact 110 shown in FIG. 2A. The corresponding shape for a base pedestal is a base pedestal with an exterior border contoured to a portion of the circular exterior border 1306. Such a base pedestal is the base pedestal 112 shown in FIG. 2B. Similarly, the corresponding shape for a base contact is a base contact with an exterior border with a portion contoured to the circular interior border 1304. Such a base contact is one with the generally circular portion 230 of the base contact 114 shown in FIG. 2C.

As shown in FIG. 12, current flows between transistor components such as the emitter, the collector contact, the base pedestal, and the base contact. It is desirable for current flowing between two components to flow proportionately, i.e. evenly, over a substantial portion of the opposing borders of a current source component and a current destination component. Contouring a substantial portion, such as the above mentioned "at least approximately 75%," of the opposing border allows for current to flow proportionately over a substantial portion of the opposing border. Contouring the opposing borders generally leads to current flowing normal to the border over a substantial portion of the border.

Figure 13B:
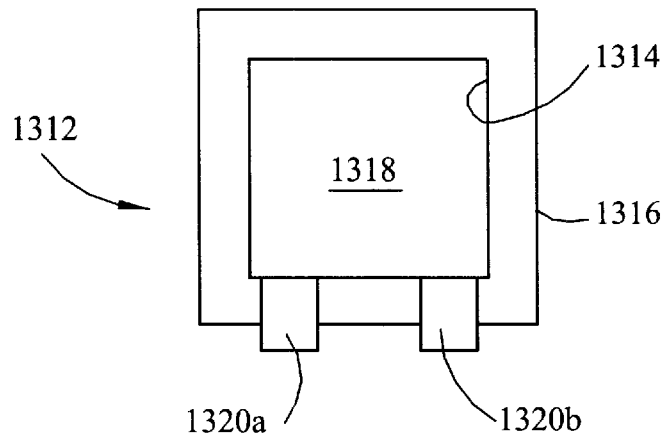

FIG. 13B shows a square emitter 1312 having a square interior border 1314, a square exterior border 1316, a square center void 1318, a first feed point 1320a, and a second feed point 1320b. For a second example of determining the corresponding shapes for other components, the corresponding shape for a collector contact is a collector contact with an interior border contoured to a portion of the square exterior border 1316. Such a collector contact has three sides with each side being approximately equidistant from the square exterior border 1316. The corresponding shape for a base pedestal is a base pedestal with an exterior border contoured to a portion of the square exterior border 1316. Such a base pedestal has three sides with each having being approximately equidistant from the square exterior border 1316. Similarly, the corresponding shape for a base contact is a base contact contoured to the square interior border 1316. Such a base contact is one with a square portion. The corresponding base contact may be disposed in the square center void 1318.

Figure 13C:
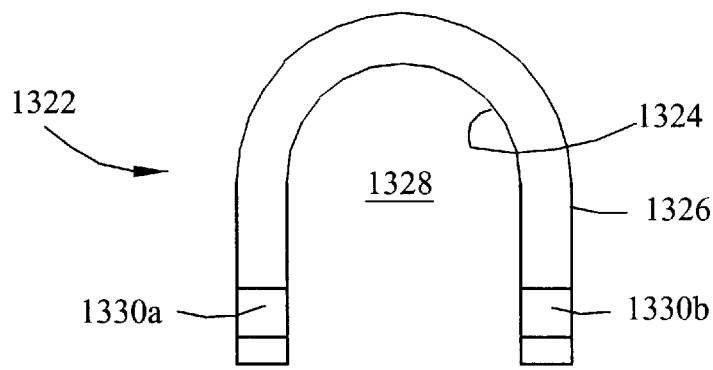

FIG. 13C shows a U-shaped emitter 1322 having a U-shaped interior border 1324, a U-shaped exterior border 1326, a U-shaped center void 1328, a first feed point 1330a, and a second feed point 1330b. For a third example of determining the corresponding shapes for other components, the corresponding shape for a collector contact is a collector contact with an interior border contoured to a portion of the U-shaped exterior border 1326. Such a collector contact is a collector contact having a U-shaped interior border. The portion of the U-shaped exterior border 1326 may be the entire U-shaped exterior border 1326, though contouring the interior border of the collector contact to the entire U-shaped exterior border 1326 is not required. The points along the U-shaped interior border of the corresponding collector contact are approximately equidistant from the emitter U-shaped exterior border 1326. The corresponding shape for a base pedestal is a base pedestal with an exterior border contoured to a portion of the U-shaped exterior border 1326. Such a base pedestal is a base pedestal having a U-shaped exterior border. The portion of the U-shaped exterior border 1326 may be the entire U-shaped exterior border 1326, though contouring the exterior border of the base pedestal to the entire U-shaped exterior border 1326 is not required. The points along the U-shaped exterior border of the corresponding base pedestal are approximately equidistant from the U-shaped exterior border 1326. The corresponding shape for a base contact is a base contact with an exterior border contoured to the U-shaped interior border 1324. Such a base contact is a base contact having an exterior border with a semicircular portion. The points along the semi-circular portion being approximately equidistant from the points along the arc of the U-shaped interior border 1324. One example of the corresponding base contact is base contact 114 (FIG. 2C). Base contact 114 has a semi-circular portion (the top half of the generally circular portion 230). Thus, base contact 114 is contoured to the U-shaped interior border 1324.

Figure 13D:
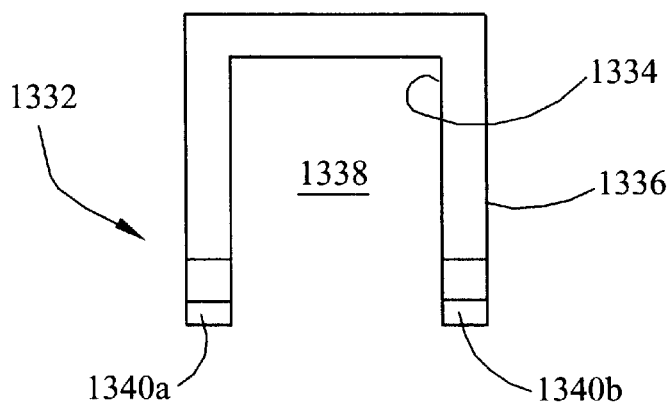
Figure 13E:
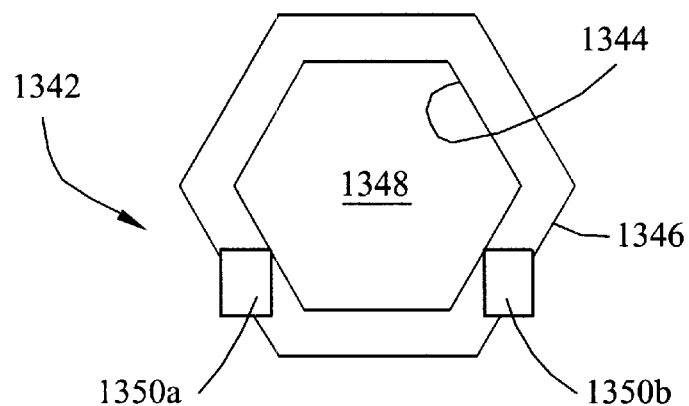
Figure 13F:
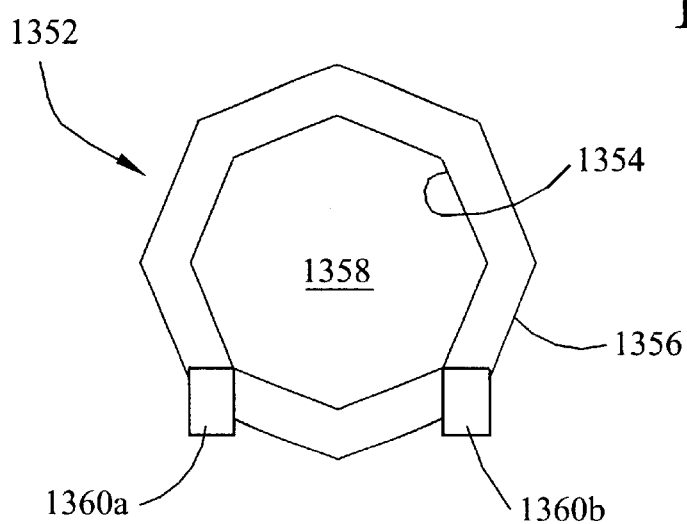

FIG. 13D shows an open rectangular shaped emitter 1332 having a three-sided interior border 1334, a three-sided exterior border 1336, a rectangular center void 1338, a first feed point 1340a, and a second feed point 1340b. FIG. 13E shows a closed hexagon shaped emitter 1342 having a hexagon interior border 1344, a hexagon exterior border 1346, a hexagon center void 1348, a first feed point 1350a, and a second feed point 1350b. FIG. 13F shows a closed octagon shaped emitter 1352 having an octagon interior border 1354, an octagon exterior border 1356, an octagon center void 1358, a first feed point 1360a, and a second feed point 1360b. Based on the descriptions above and accompanying drawings, those of ordinary skill in the art will be able to design other components having portions contoured to the additional emitter embodiments shown in FIGS. 13A to 13F. Emitters 1302, 1312, 42, and 1352 may be referred to as closed emitters. Emitters 1322 and 1332 may be referred to as open emitters.

Emitters may have layouts other than those shown in FIGS. 13A to 13F. Based on the descriptions above and accompanying drawings, those of ordinary skill in the art will be able to design other components having portions contoured to additional layouts other than those shown in FIGS. 13A to 13F. Any emitter layout, that in conjunction with a contoured collector contact allows current to flow between the collector contact and the emitter in a direction generally normal to the interior border of the collector contact, results in a low collector-to-emitter resistance. Any emitter layout that has multiple feed points decreases the susceptibility to emitter failure due to hot spots. Any transistor layout that places the base contact within the emitter center void partially isolates the base contact and decreases the base-to-collector capacitance.

Figure 14:
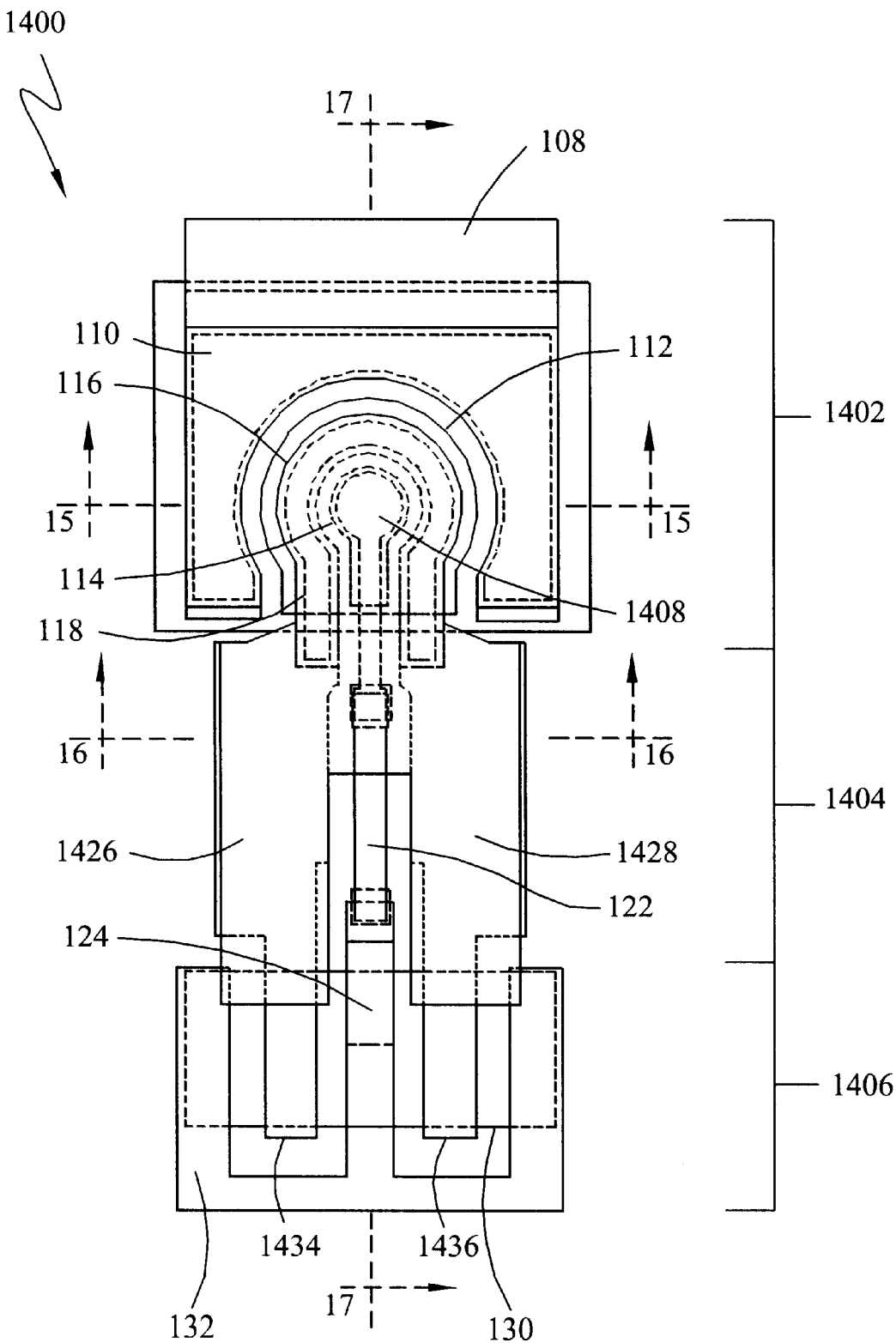
FIG. 14 is a plan view of another embodiment of the transistor layout incorporating additional heat shunting capabilities.

FIG. 14, is a plan view of another embodiment of the transistor layout incorporating additional heat shunting capabilities. The descriptions noted in regard to transistor 100 apply to transistor 1400 other than where noted below. FIG. 14 shows a plan view of transistor 1400. Transistor 1400 includes an intrinsic section 1402, a second section 1404, and a third section 1406. The intrinsic section 1402 is almost identical to the intrinsic section 102 of transistor 100. However, a second metal layer 2100 (FIG. 21) includes a key-shaped fill portion 1408 that covers the base contact 114. The emitter 116 and the emitter contact 118 extend into the second section 1404.

The second section 1404 includes a first leg portion 1426 of the second metal layer 2100, and a second leg portion 1428 of the second metal layer 2100. The first leg portion 1426 and the second leg portion 1428 are wider than the corresponding portions of transistor 100.

The third section 1406 includes an emitter ballast resistor 130 a first leg portion 1434 of a first metal layer 1900 (FIG. 19), and a second leg portion 1436 of the first metal layer 1900. The first leg portion 1434 and the second leg portion 1436 are wider than the corresponding portions of transistor 100. The first leg portion 1434 and the second leg portion 1436 of the first metal layer 1900 extend into the second section 1404. The wider portions of the first leg portion 1434 and the second leg portion 1436 of the first metal layer 1900 are also shown in FIG. 16.

Figure 15:
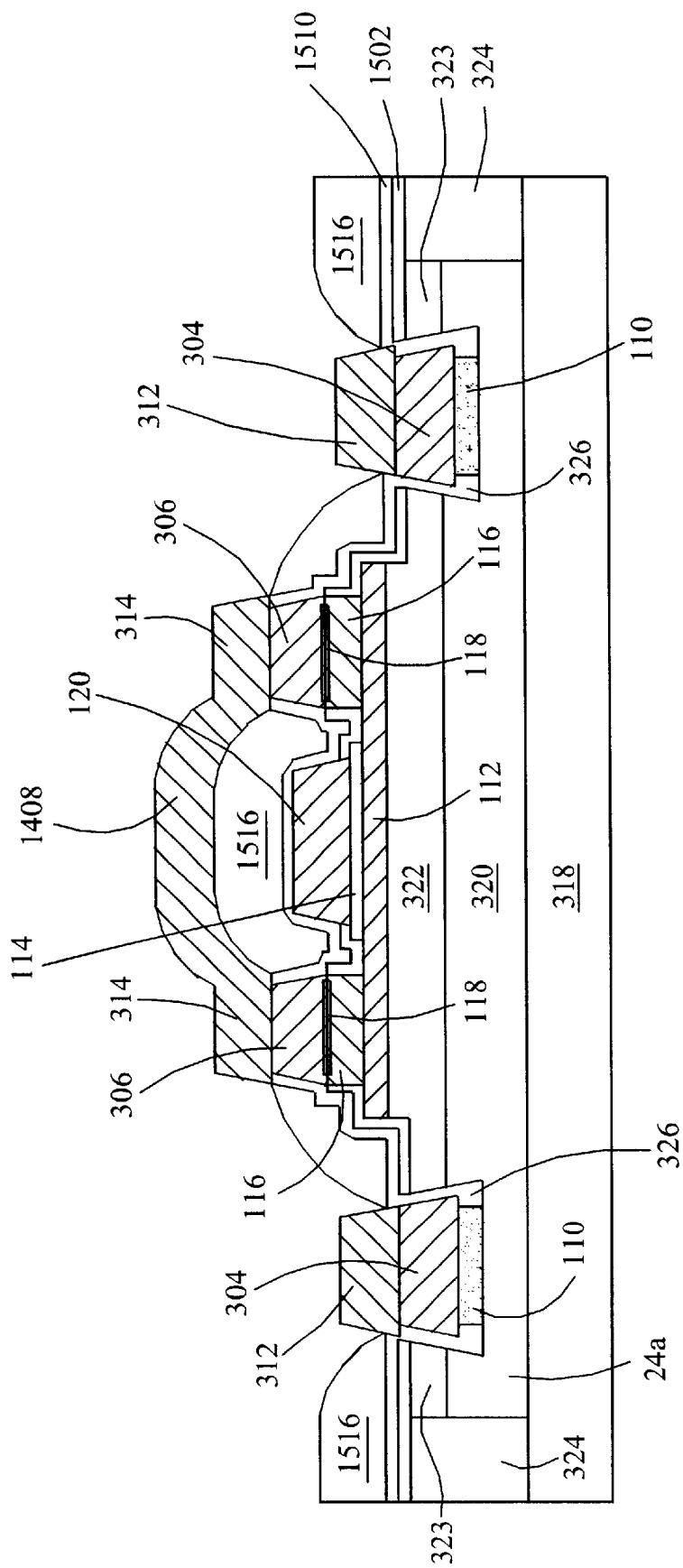
FIG. 15 is a cross-sectional view of the intrinsic section of the transistor of FIG. 14.

FIG. 15 is a cross-sectional view of the intrinsic section 1402 of transistor 1400 through section line 15 of FIG. 14. FIG. 15 shows a cross-sectional view of the key-shaped fill portion 1408 of the second metal layer 2100 (FIG. 21), a first dielectric layer 1502, a second dielectric layer 1510, and a third dielectric layer 1516. The key-shaped fill portion 1408 is an additional heat path providing more efficient and even distribution of heat away from the emitter 116 area.

Figure 16:
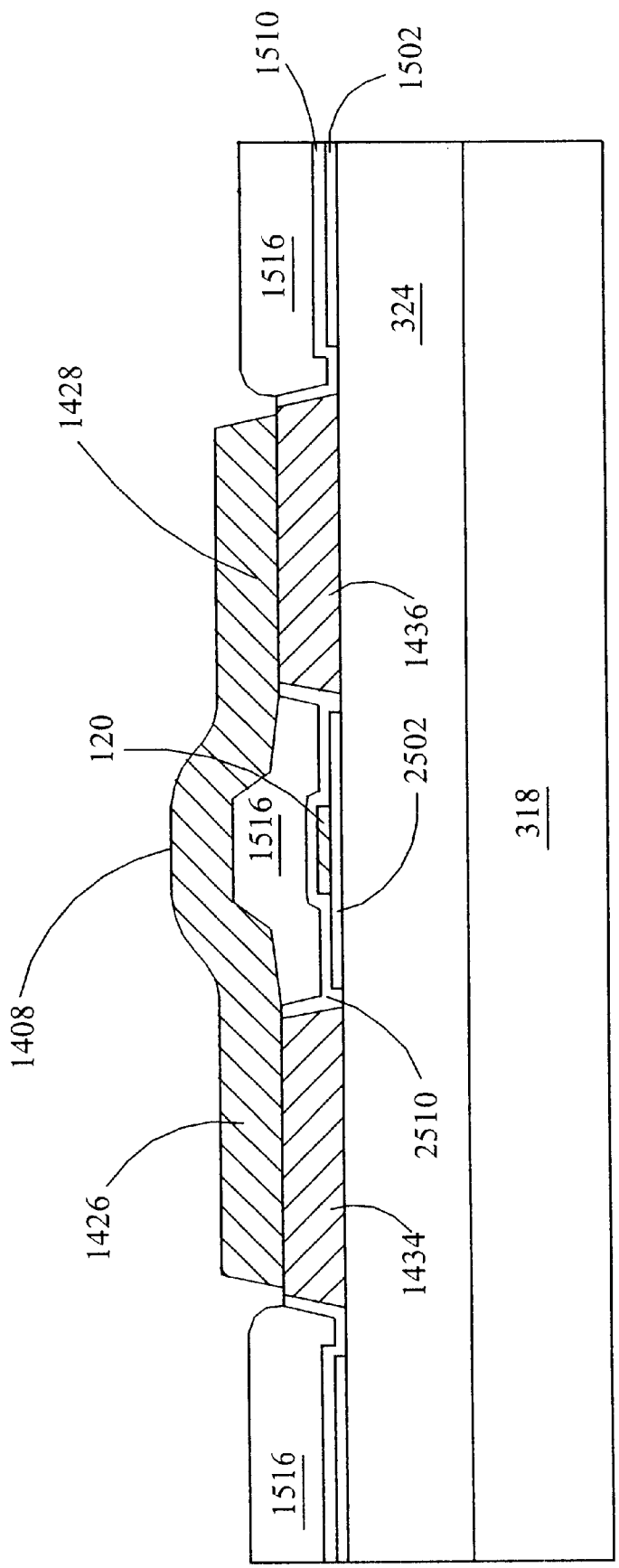
FIG. 16 is a cross-sectional view of the second section of the transistor of FIG. 14.

FIG. 16 is a cross-sectional view of the second section 1404 of transistor 1400 through section line 16 of FIG. 14. FIG. 16 shows the key-shaped fill portion 1408 of the second metal layer 2100 (FIG. 21), the first leg portion 1426 of the second metal layer 2100, the second leg portion 1428 of the second metal layer 2100, the first leg portion 1434 of the first metal layer 1900 (FIG. 19), and the second leg portion 1436 of the first metal layer 1900. The first leg portion 1426 and the second leg portion 1428 of the second metal layer 2100 are wider in transistor 1400 than the corresponding portions of the second metal layer 1000 of transistor 100. FIG. 16 also shows the first leg portion 1434 and the second leg portion 1436 of the first metal layer 1900 are wider in transistor 1400 than the corresponding portions of the first metal layer 800 of transistor 100.

Figure 17:
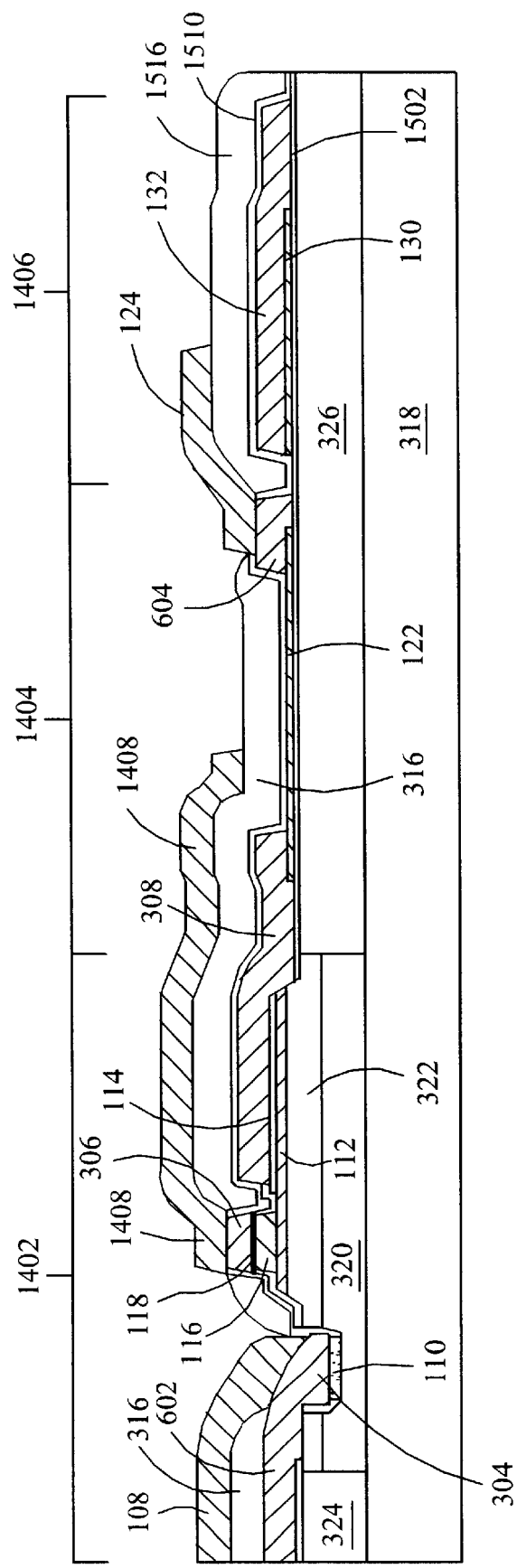
FIG. 17 is a cross-sectional view of the transistor of FIG. 14 through the intrinsic section, the second section, and the third section.

FIG. 17 is a cross-sectional view of the intrinsic section 1402, the second section 1404, and the third section 1406 of transistor 1400 through section line 17 of FIG. 14. FIG. 17 shows the key-shaped fill portion 1408 of the second metal layer 2100 (FIG. 21) extending from the intrinsic section 1402 to the second section 1404.

Figure 18:
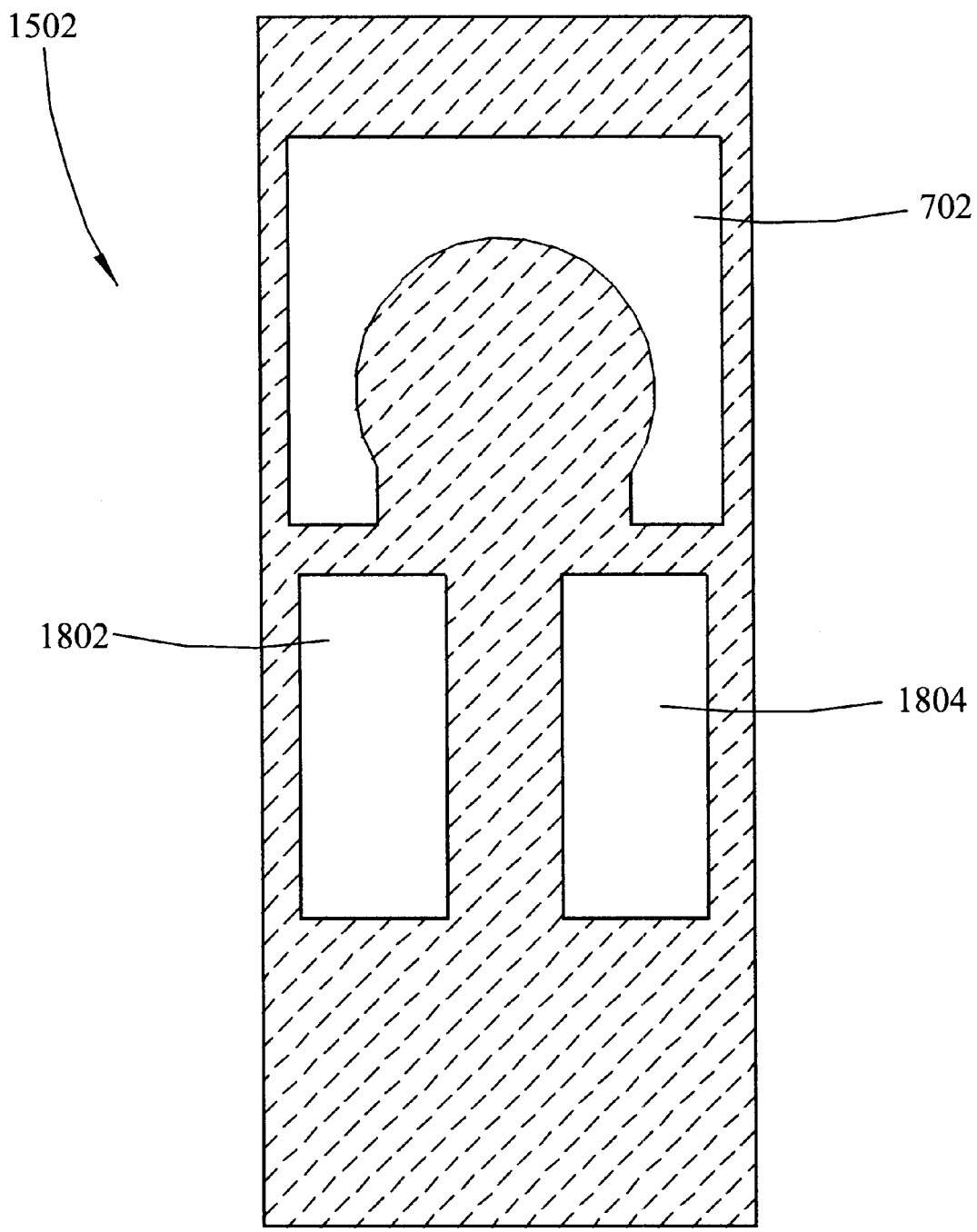
FIG. 18 is a plan view of the first dielectric layer of the transistor of FIG. 14.

FIG. 18 is a plan view of the first dielectric layer 1502 of transistor 1400 of FIG. 14. The first dielectric layer includes a first dielectric collector contact window 702, a first leg window 1802, and a second leg window 1804. The first leg window 1802 provides a heat path between the first leg portion 1434 of the first metal layer 1900 and first leg portion 1426 of the second metal layer 2100. The second window 1804 provides a heat path between the second leg portion 1436 of the first metal layer 1900 and the second metal leg 1428 of the second metal layer 2100.

Figure 19:
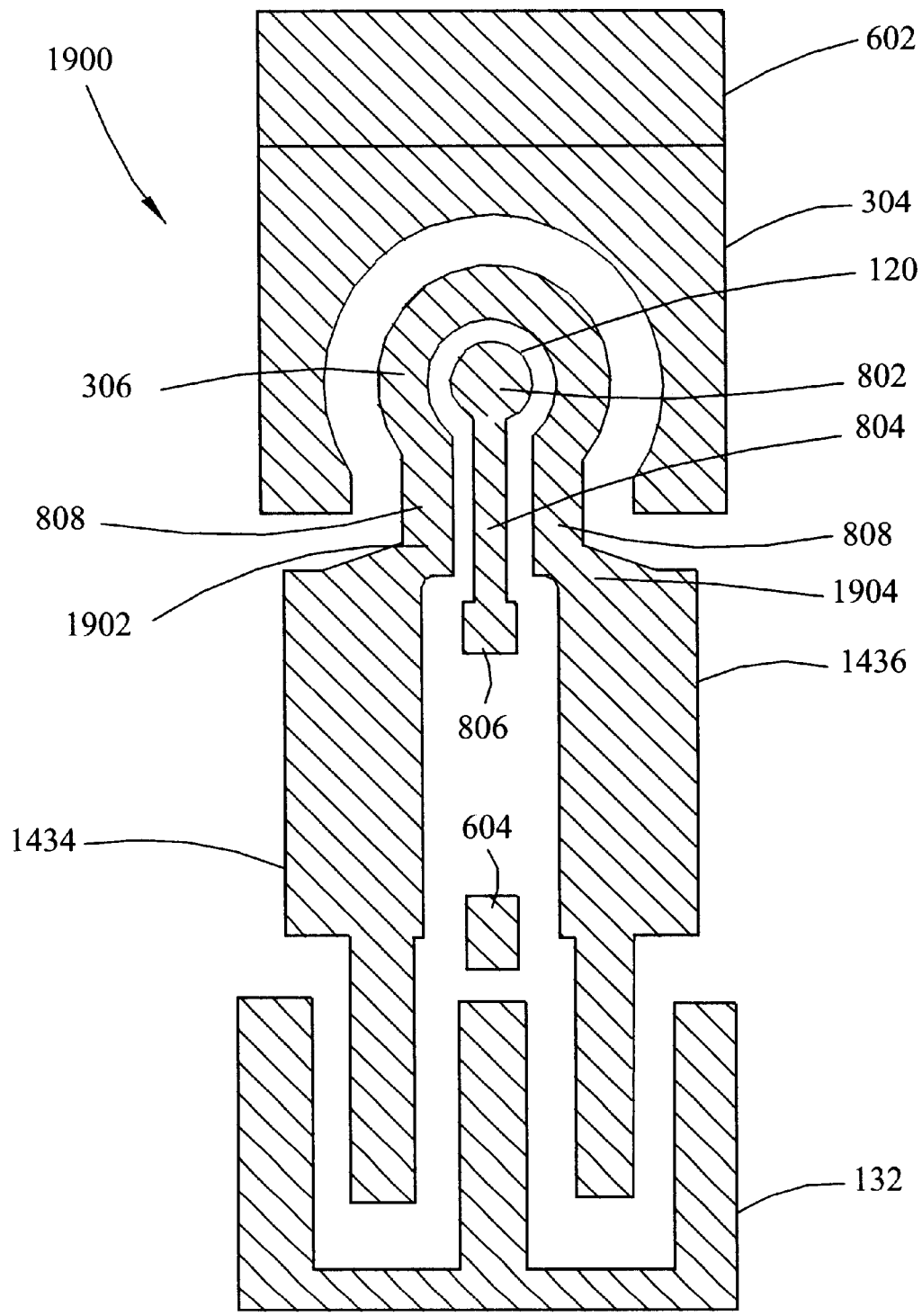
FIG. 19 is a plan view of the first metal layer of the transistor of FIG. 14.

FIG. 19 is a plan view of the first metal layer 1900 of transistor 1400 of FIG. 14. FIG. 14 shows the terminal portion 808 of the emitter contact portion 306 is connected to the first leg portion 1434 by a first shunt fill portion 1902. FIG. 19 shows the terminal portion 808 of the emitter contact portion 306 is connected to the second leg portion 1436 by second shunt fill portion 1904. First leg portion 1434 and second leg portion 1436 of transistor 1400 are wider than corresponding portions of transistor 100.

Figure 20:
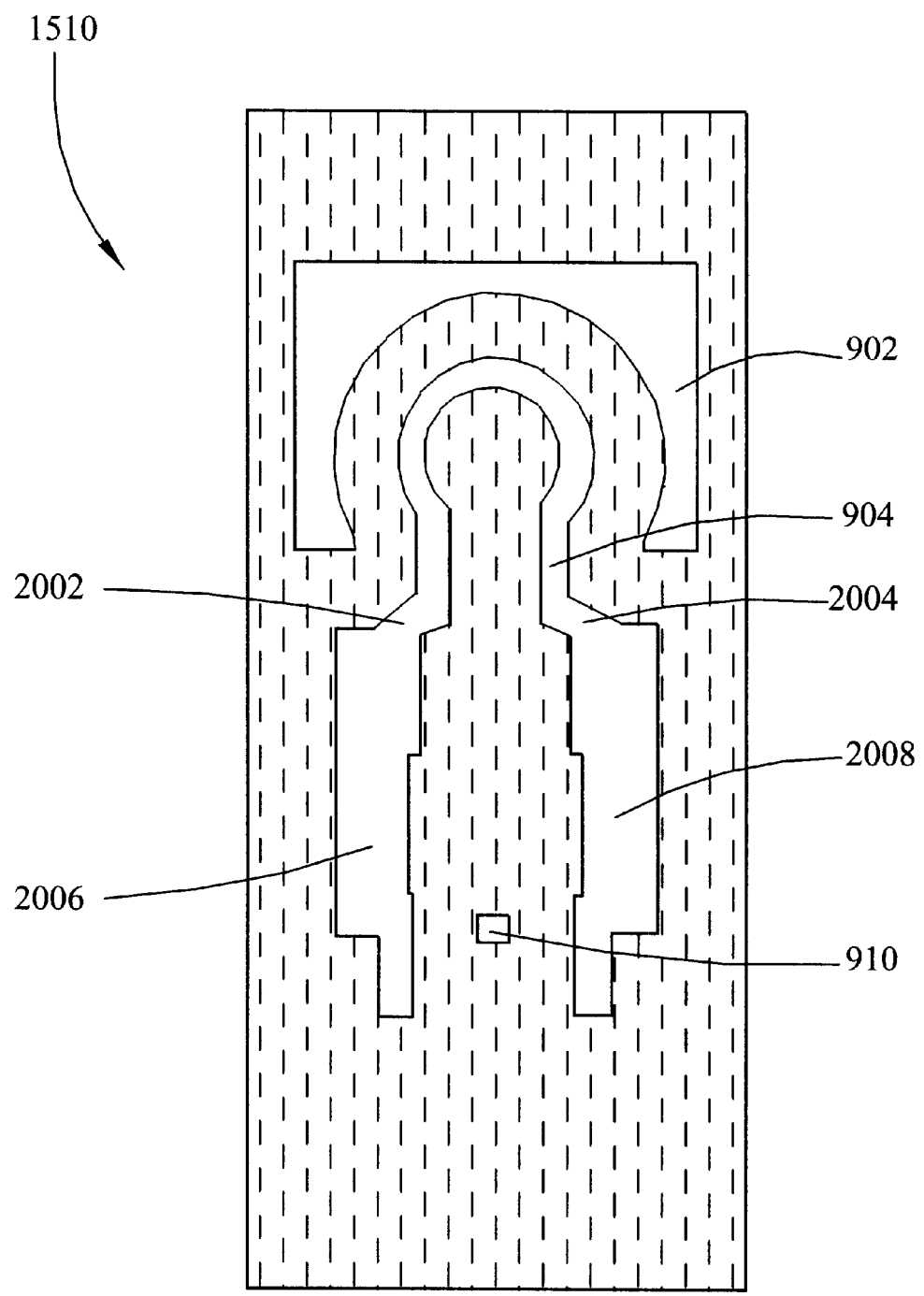
FIG. 20 is a plan view of the second dielectric layer of the transistor of FIG. 14.

FIG. 20 is a plan view of the second dielectric layer 1510 of transistor 1400 of FIG. 14. Second dielectric window 1510 includes a first leg window 2006, and a second leg window 2008. First leg window 2006 is connected to the emitter contact window 904 by first window connector portion 2002. Second leg window 2008 is connected to the emitter contact window 904 by second window contact portion 2004. First leg window 2006 and second leg window 2008 of transistor 1400 are wider than the corresponding portions of transistor 100. First leg window 2006 and second leg window 2008 provide wider heat paths between the leg portions 1434 and 1436 of the first metal layer 1900 and the leg portions 1426 and 1428 of the second metal layer 2100. First window contact portion 2002 and second window contact portion 2004 provide an additional heat path between the first metal layer 1900 and the second metal layer 2100.

Figure 21:
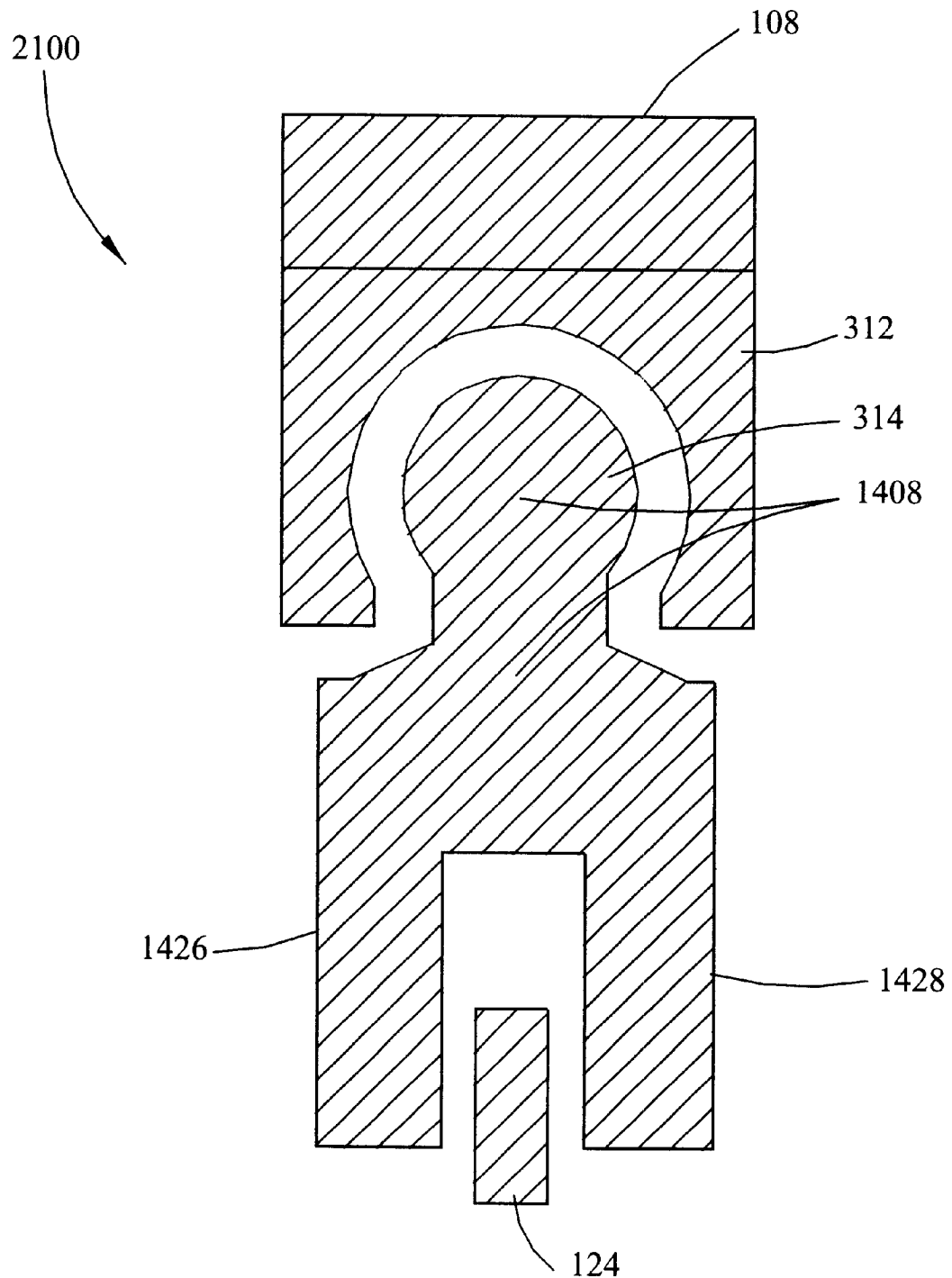
FIG. 21 is a plan view of the second metal layer of the transistor of FIG. 14.

FIG. 21 is a plan view of the second metal layer 2100 of transistor 1400 of FIG. 14. Second metal layer 2100 includes the key-shaped fill portion 1408, a first leg portion 1426, and a second leg portion 1428. The key-shaped fill portion 1408 occupies the key-shaped void 1002 defined by the second metal layer 1000 of transistor 100. The key-shaped fill portion 1408 provides an additional heat path between the emitter current carrying components of the transistor 1400 and the inactive region 324. Key-shaped fill portion 1408 also provides a heat path from the generally warmer first section 1402 to the generally cooler second section 1404.

Figure 22:
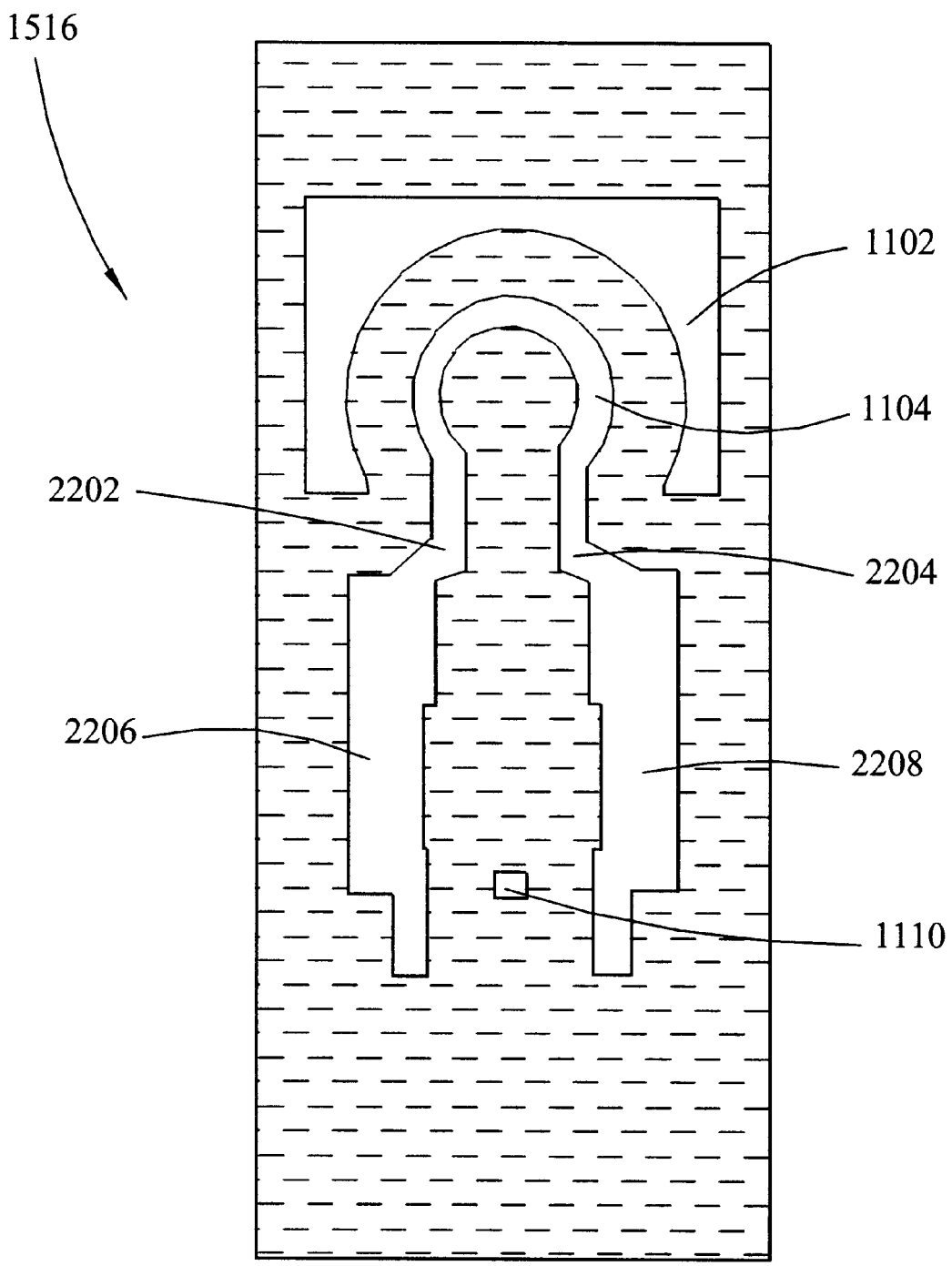
FIG. 22 is a plan view of the third dielectric layer of the transistor of FIG. 14.

FIG. 22 is a plan view of the third dielectric layer 1516 of transistor 1400 of FIG. 14. Third dielectric layer 1516 includes a first leg window 2206 and a second leg window 2208. First leg window 2206 is connected to emitter contact window 1104 by first window connector portion 2202. Second leg window 2208 is connected to the emitter contact window 1104 by second window contact portion 2204. First leg window 2206 and second leg window 2208 of transistor 1400 are wider than the corresponding portions of transistor 100. First leg window 2206 and second leg window 2208 provide wider heat paths between leg portions 1434 and 1436 of the first metal layer 1900 and leg portions 1426 and 1428 of the second metal layer 2100. First window contact portion 2206 and second window contact portion 2208 provide an additional heat path between the first metal layer 1900 and the second metal layer 2100.

Figure 23:
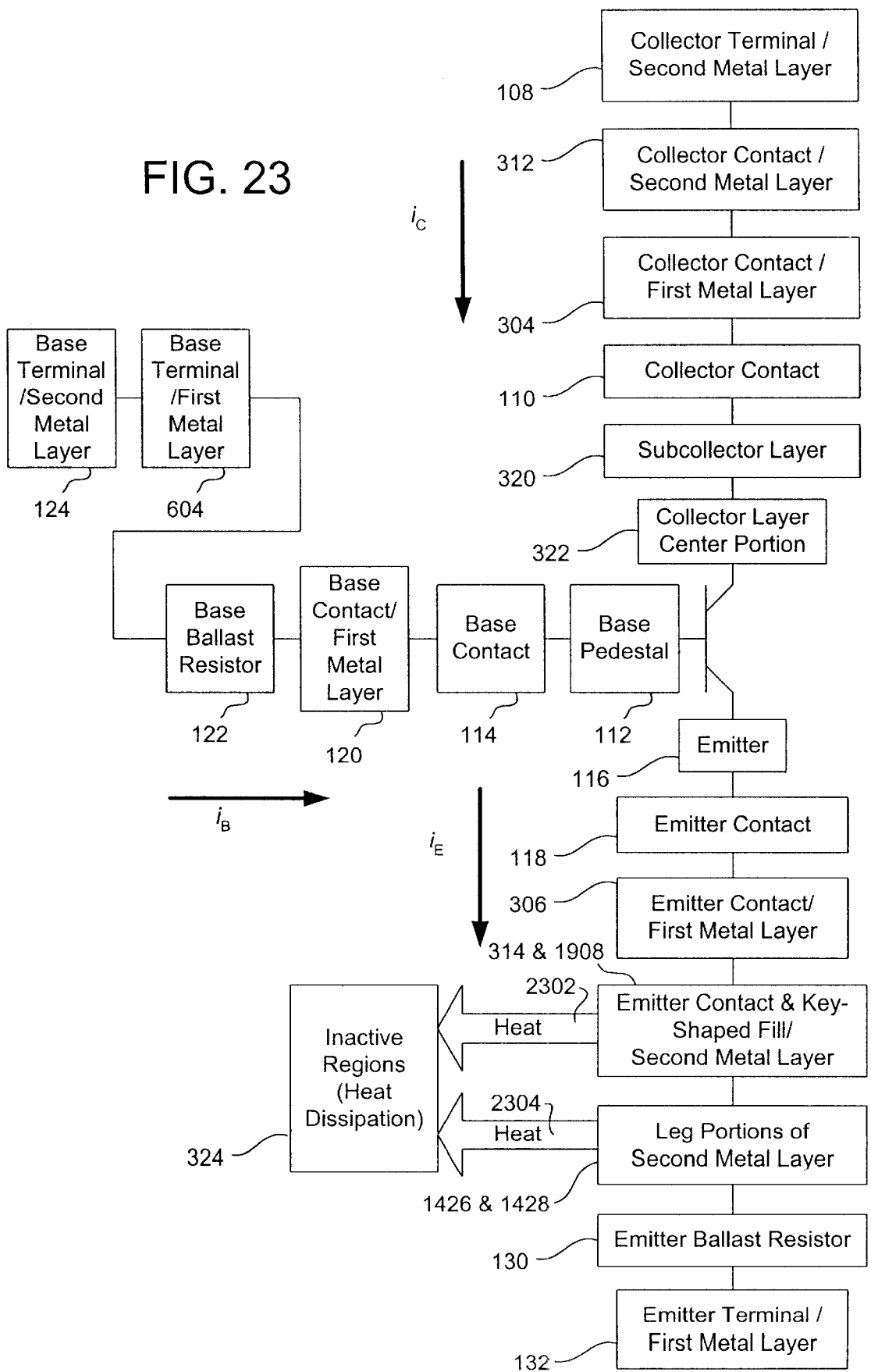
FIG. 23 is a block diagram illustrating the electrical and thermal interaction of the components included in the transistor of FIG. 14.

FIG. 23 is a block diagram illustrating the electrical and thermal interaction of the components included in transistor 1400 of FIGS. 14 to 22. The descriptions noted in regard FIG. 12 apply to FIG. 23 other than where noted below. FIG. 23 shows a first heat path 2302 and a second heat path 2304. First heat path 2302 allows for heat to be transferred from the emitter contact 314 and key-shaped fill portion 1908 of the second metal layer 2100 to the inactive region 324. Second heat path 2304 allows for heat to be transferred from the first leg portion 1426 and the second leg portion of the second metal layer 2100 to the inactive region 324.

First heat path 2302 has greater heat conduction capacity due to the key-shaped filled portion 1408 of the second metal layer 2100, first shunt fill portion 1902 second shunt fill portion 1904 of the first metal layer 1900, first window connector portion 2002 and second window connector portion 2004 of the second dielectric layer, and by first window connector portion 2202 and second window connection portion 2204 of the third dielectric layer 1516.

Second heat path 2304 has greater heat conduction capacity due to the first leg window 1802 and second leg window 1804 of the first dielectric layer 1502, the wider first leg portion 1434 and second wider leg portion 1436 of the first metal layer 1900, wider first leg window 2006 and second leg window 2008 of the second dielectric layer 1510, wider first leg portion 1426 and second leg portion 1428 of the second metal layer 2100, and the wider first leg window 2206 and a second leg window 2208 of the third dielectric layer 1516.

Figure 24:
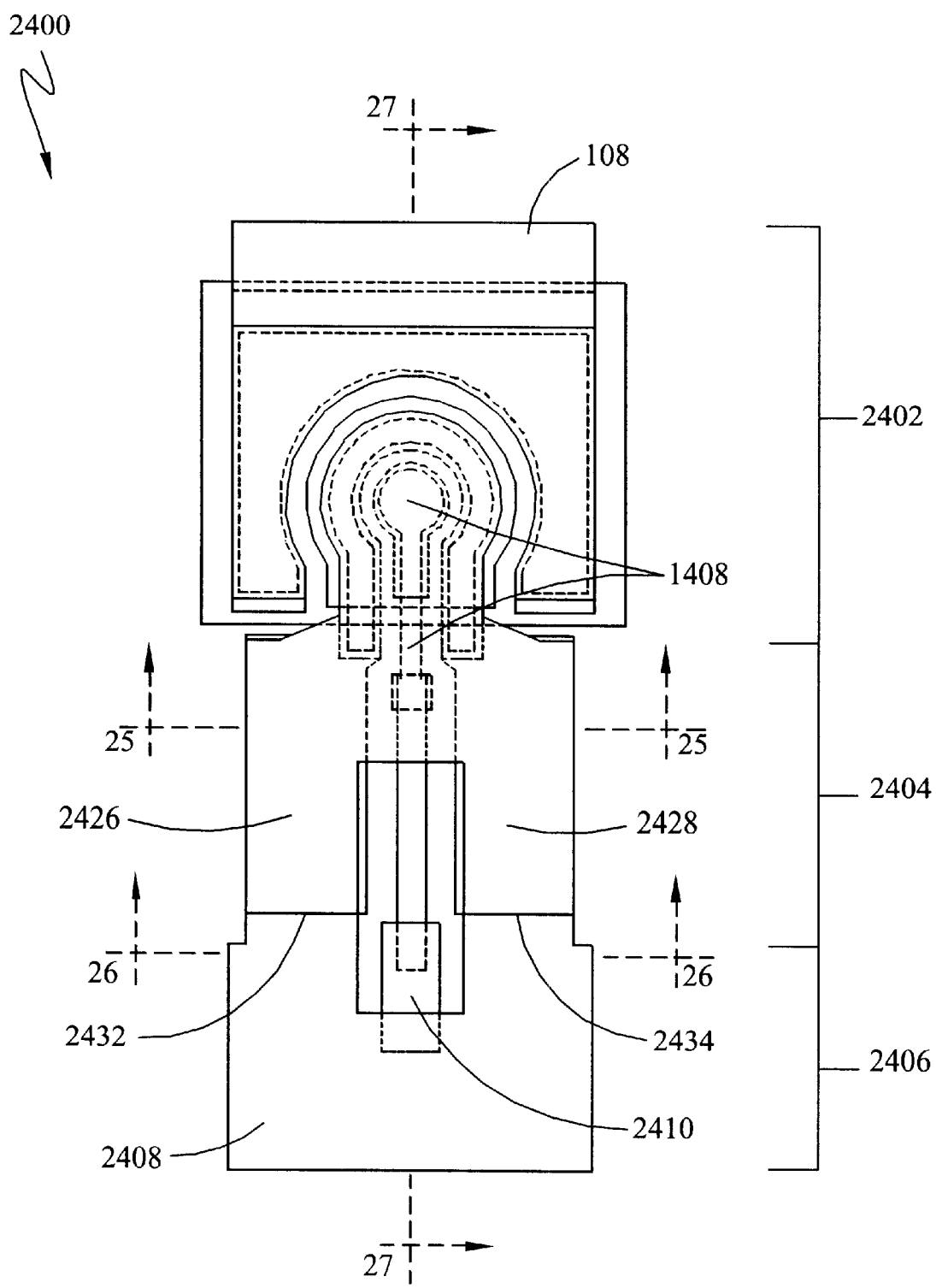
FIG. 24 is a plan view of another embodiment of the transistor layout incorporating additional heat shunting capabilities.

FIG. 24 is a plan view of a another embodiment of the transistor layout incorporating additional heat shunting capabilities and omitting the emitter ballast resistor 122 of transistor 100 and transistor 1400. The descriptions noted in regard to transistor 1400 apply to transistor 2400 other than where noted below. FIG. 24 shows a plan view of transistor 2400. For applications that do not require an emitter ballast resistor, transistor 2400 provides greater heat conduction from the emitter current carrying components to the inactive region 324. Transistor 2400 includes an intrinsic section 2402, a second section 2404, and a third section 2406. The intrinsic section 2402 is identical to the intrinsic section 1402.

Figure 28:
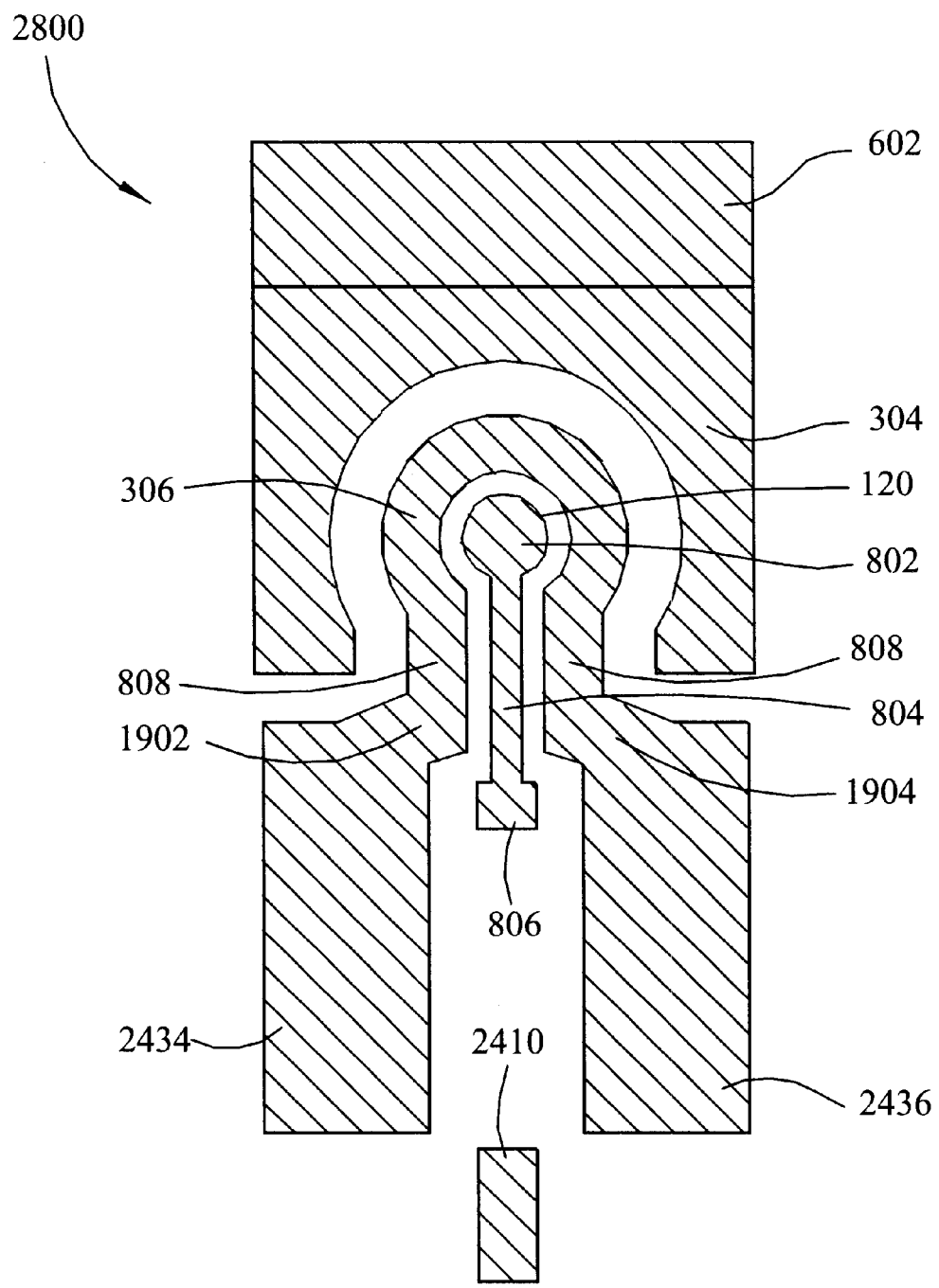
FIG. 28 is a plan view of the first metal layer of the transistor of FIG. 24.

The second section 2404 includes a first leg portion 2426 of the second metal layer 3000 (FIG. 30), and a second leg portion 2428 of the second metal layer 3000. The first leg portion 2426 and the second leg portion 2428 are wider than the corresponding portions of transistor 1400. The second section 2404 also includes a first leg portion 2434 and a second leg portion 2436 of the first metal layer 2800 (FIG. 28). The first leg portion 2434 and the second leg portion 2436 of the first metal layer 2800 do not extend to the third section 2406.

The third section 2406 includes an emitter terminal portion 2408 of the second metal layer 3000 and a base terminal portion 2410 of the first metal layer 2800 (FIG. 28).

Figure 25:
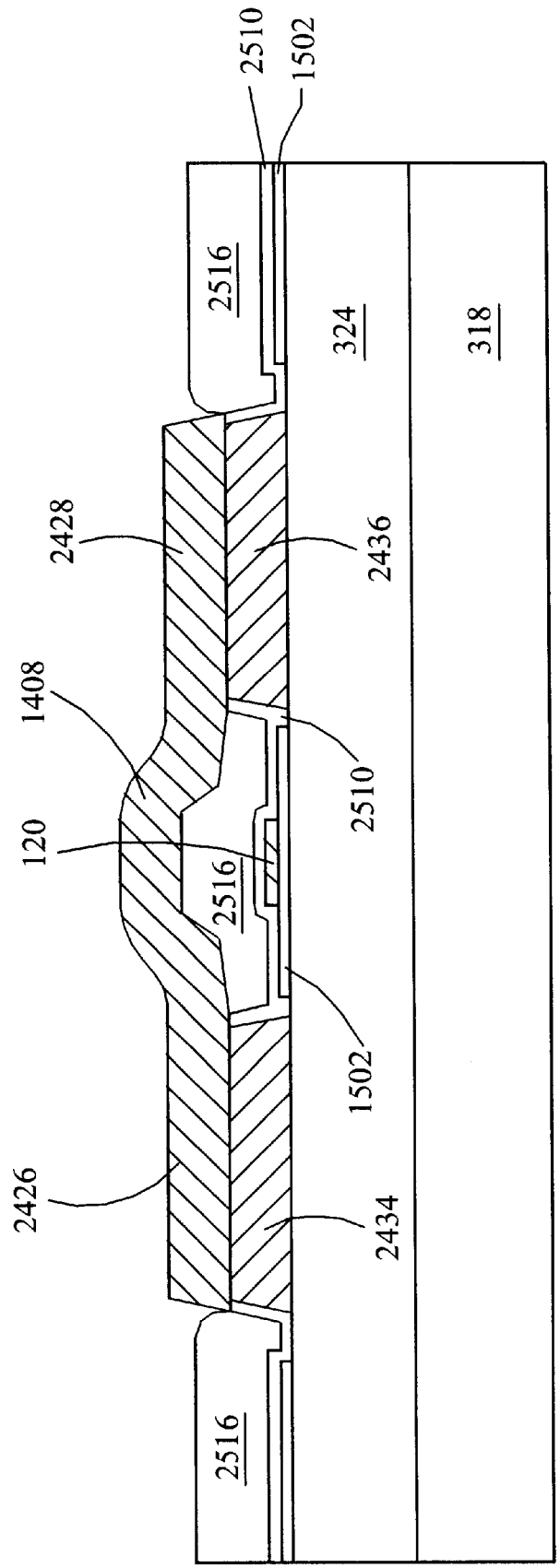
FIG. 25 is a cross-sectional view of the second section of the transistor of FIG. 24.

FIG. 25 is a cross-sectional view of the second section 2404 of transistor 2400 through section line 25 of FIG. 24. FIG. 25 shows the key-shaped fill portion 1408 of the second metal layer 3000 (FIG. 30), the first leg portion 2426 and the second leg portion 2428 of the second metal layer 3000, the first leg portion 2434 and the second leg portion 2436 of the first metal layer 2800 (FIG. 28). The first leg portion 2426 and the second leg portion 2428 of the second metal layer 3000 are wider in transistor 2400 than the corresponding portions of the second metal layer 2100 of transistor 1400. The first dielectric layer of transistor 2400 is similar to the first dielectric layer 1502 of transistor 1400. FIG. 25 also shows second dielectric layer 2510 and third dielectric layer 2516.

Figure 26:
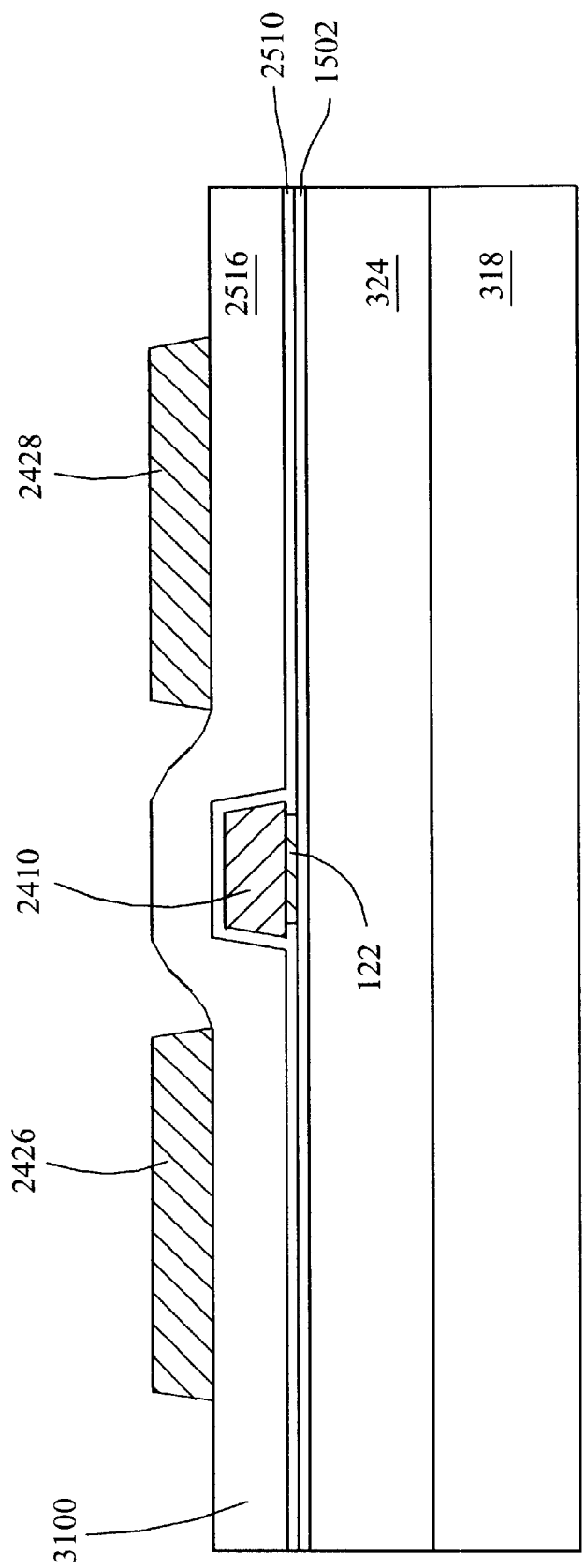
FIG. 26 is a cross-sectional view of the third section of the transistor of FIG. 24.

FIG. 26 is a cross-sectional view of the third section 2406 of transistor 2400 through section line 26 of FIG. 24. FIG. 26 shows the first leg portion 2426 and the second leg portion 2428 of the second metal layer 3000 (FIG. 30), the base ballast resistor 122, the first dielectric layer 1502, the second dielectric layer 2510, the third dielectric layer 2516, and the base terminal portion 2410 of the first metal layer 2800 (FIG. 28). FIG. 26 also shows the first leg portion 2532 and the second leg portion 2534 of the first metal layer 2800 do not extend into the third section 2406 of transistor 2400. FIG. 26 also shows that the transistor 2400 does not include some components of transistors 100 and 1400, such as the base terminal portion 124 of the second metal layer 1000 and the emitter terminal portion 132 of the first metal layer 800.

Figure 27:
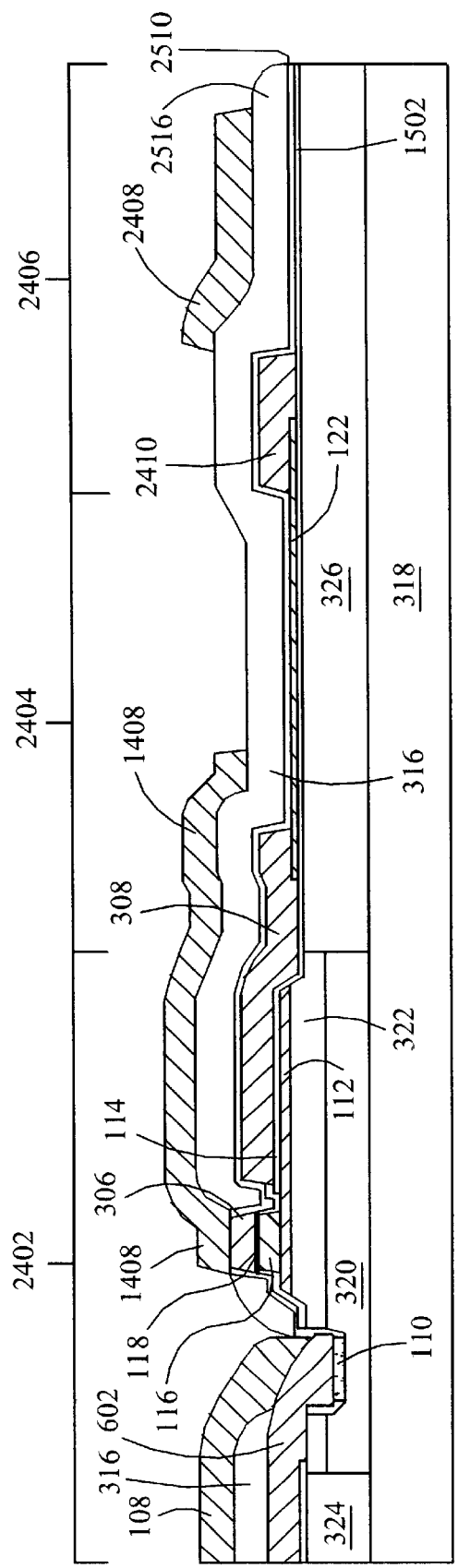
FIG. 27 is a cross-sectional view of the transistor of FIG. 24 through the intrinsic section, the second section, and the third section.

FIG. 27 is a cross-sectional view of the intrinsic section 2402, the second section 2404, and the third section 2406 of transistor 2400 through section line 27 of FIG. 24. FIG. 27 shows the third dielectric layer 2516 runs continuously from second section 2404 to third section 2406 through the cross-sectional view of FIG. 27. The third dielectric layer is not interrupted in this view by the base terminal portion of the second metal layer as in transistor 100 and transistor 2400. FIG. 27 also shows the emitter terminal portion 2408 of the second metal layer 3000 (FIG. 30) and the base terminal portion 2410 of the first metal layer 2800 (FIG. 28). The base terminal portion 2410 of the first metal layer 2800 is longer than the corresponding components of transistor 100 and transistor 1400.

FIG. 28 is a plan view of the first metal layer 2800 of transistor 2400 of FIG. 24. FIG. 28 includes the first leg portion 2434, the second leg portion 2436, and the base terminal portion 2410. FIG. 28 shows the first leg portion 2434 and the second leg portion 2436 of transistor 2400 are wider than corresponding portions of transistor 100 and transistor 2400.

Figure 29:
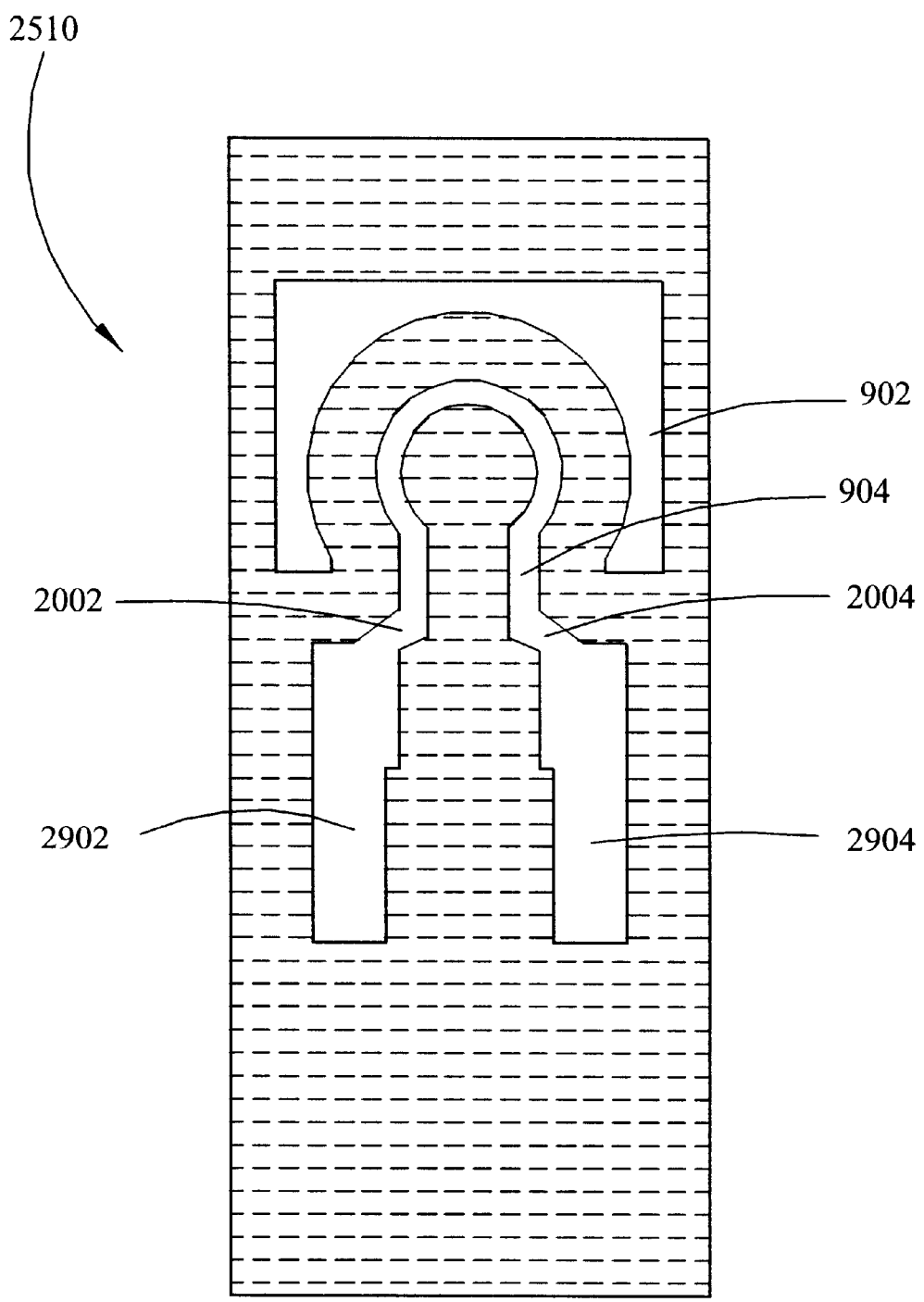
FIG. 29 is a plan view of a second dielectric layer of the transistor of FIG. 24.

FIG. 29 is a plan view of the second dielectric layer 2510 of transistor 2400 of FIG. 24. Second dielectric window 2510 includes a first leg window 2902, and a second leg window 2904. In contrast to the corresponding portions of transistor 100 and transistor 1400, the first leg window 2902 and the second leg window 2904 do not extend into the third section of transistor 2400. FIG. 29 also show that second dielectric layer 2510 does not include the base terminal window portion 910 of transistor 100 and transistor 1400.

Figure 30:
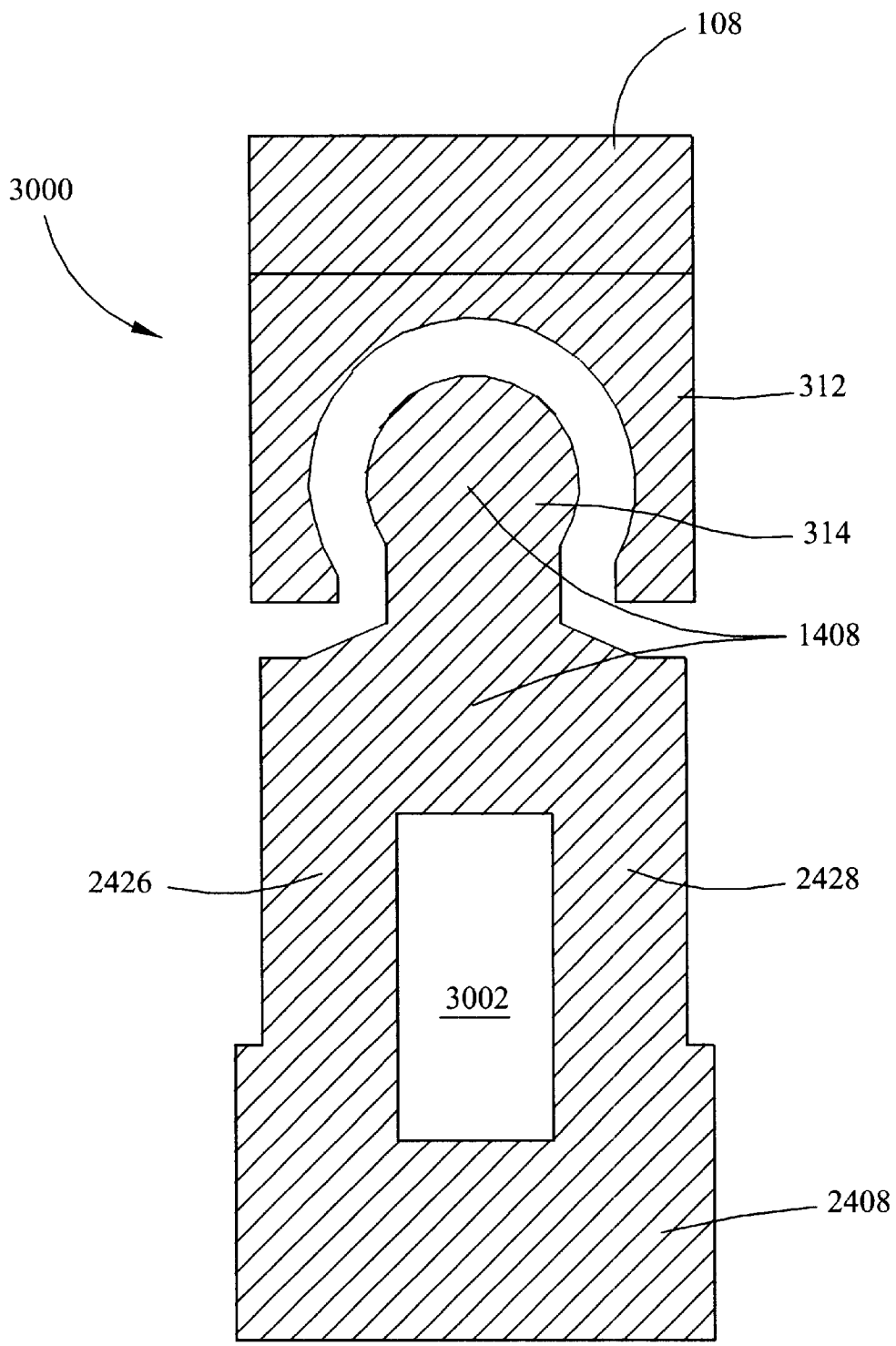
FIG. 30 is a plan view of the second metal layer of the transistor of FIG. 24.

FIG. 30 is a plan view of the second metal layer 3000 of transistor 2400 of FIG. 24. Second metal layer 3000 includes the emitter terminal portion 2408, the first leg portion 2426, and the second leg portion 2428. The emitter terminal portion 2408 provides an additional heat path between the emitter current carrying components of transistor 2400 and the inactive region 324. FIG. 30 shows the second metal layer 3000 does not include the base terminal portion 124 of transistor 100 and transistor 2400. FIG. 30 includes a void 3002. In an alternative embodiment, void 3002 may be filled.

Figure 31:
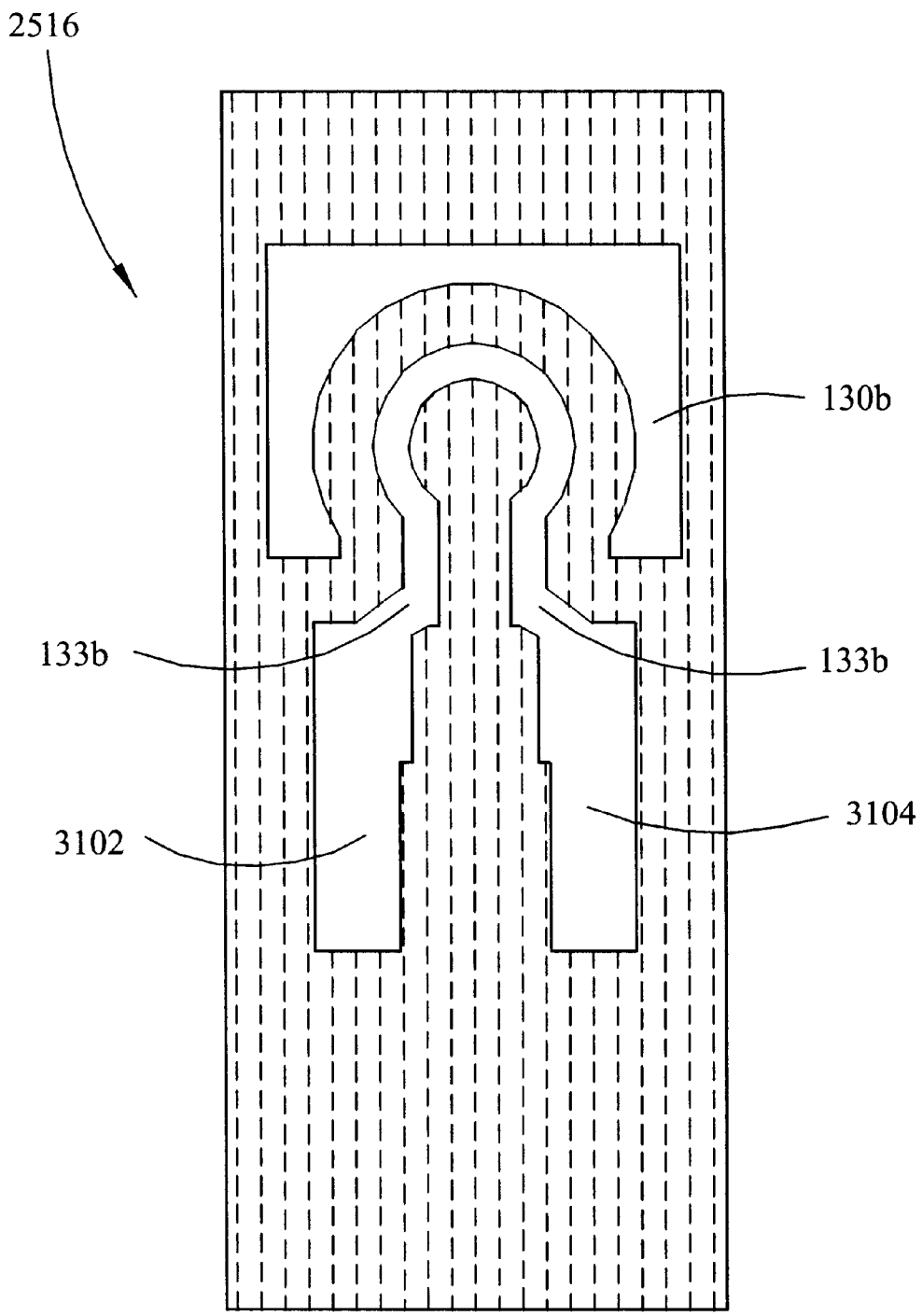
FIG. 31 is a plan view of a third dielectric layer of the transistor of FIG. 24.

FIG. 31 is a plan view of the third dielectric layer 2516 of transistor 2400 of FIG. 24. Third dielectric layer 2516 includes a first leg window 3102, and a second leg window 3104. In contrast to the corresponding components of transistor 100 and transistor 1400, the first leg window 3102 and the second leg window 3104 do not extend into the third section 2406 of transistor 2400. FIG. 31 also shows the third dielectric layer 2516 does not include the base terminal window portion 1110 of transistor 100 and transistor 1400.

Figure 32:
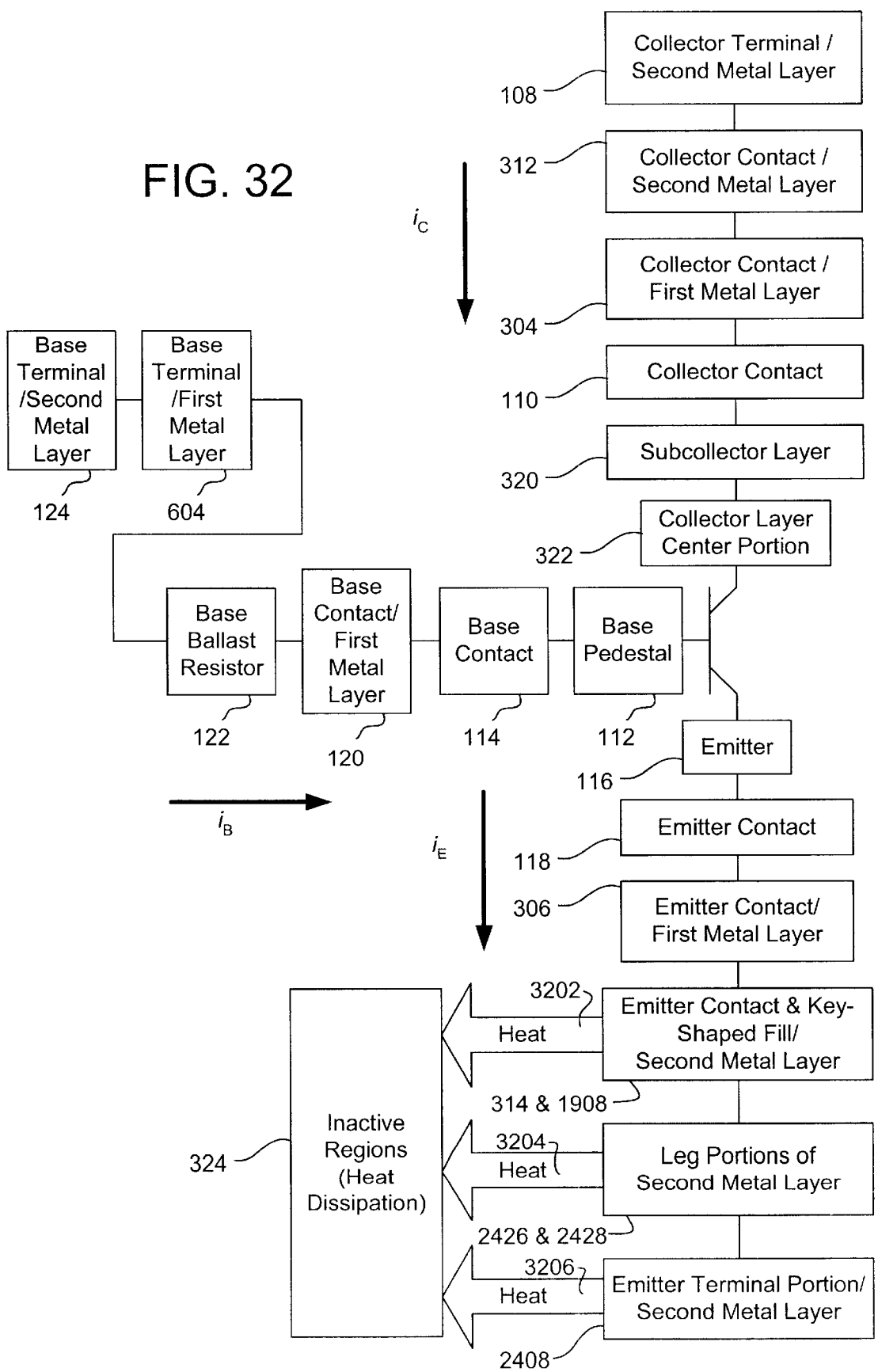
FIG. 32 is a block diagram illustrating the electrical and thermal interaction of the components included in the transistor of FIG. 24.

FIG. 32 is a block diagram illustrating the electrical and thermal interaction of the components included in transistor 2400 of FIGS. 24 to 31. FIG. 32 shows first heat path 2302, a second heat path 3204, and a third heat path 3206. A description of first heat path 3202 is provided above in reference to FIG. 23. Second heat path 3204 allows for heat to be transferred from the first leg portion 2426 and the second leg portion 2428 of the second metal layer 3000 to the inactive region 324. Third heat path allows for heat to be transferred from the emitter terminal portion 2408 of the second metal layer 3000 to the inactive region 324. Second heat path 3204 has greater heat conduction capacity due to the wider first leg portion 2434 and wider second leg portion 2436 of the first metal layer 2800, and the wider first leg portion 2426 and second leg portion 2428 of the second metal layer 3000.

Figure 33:
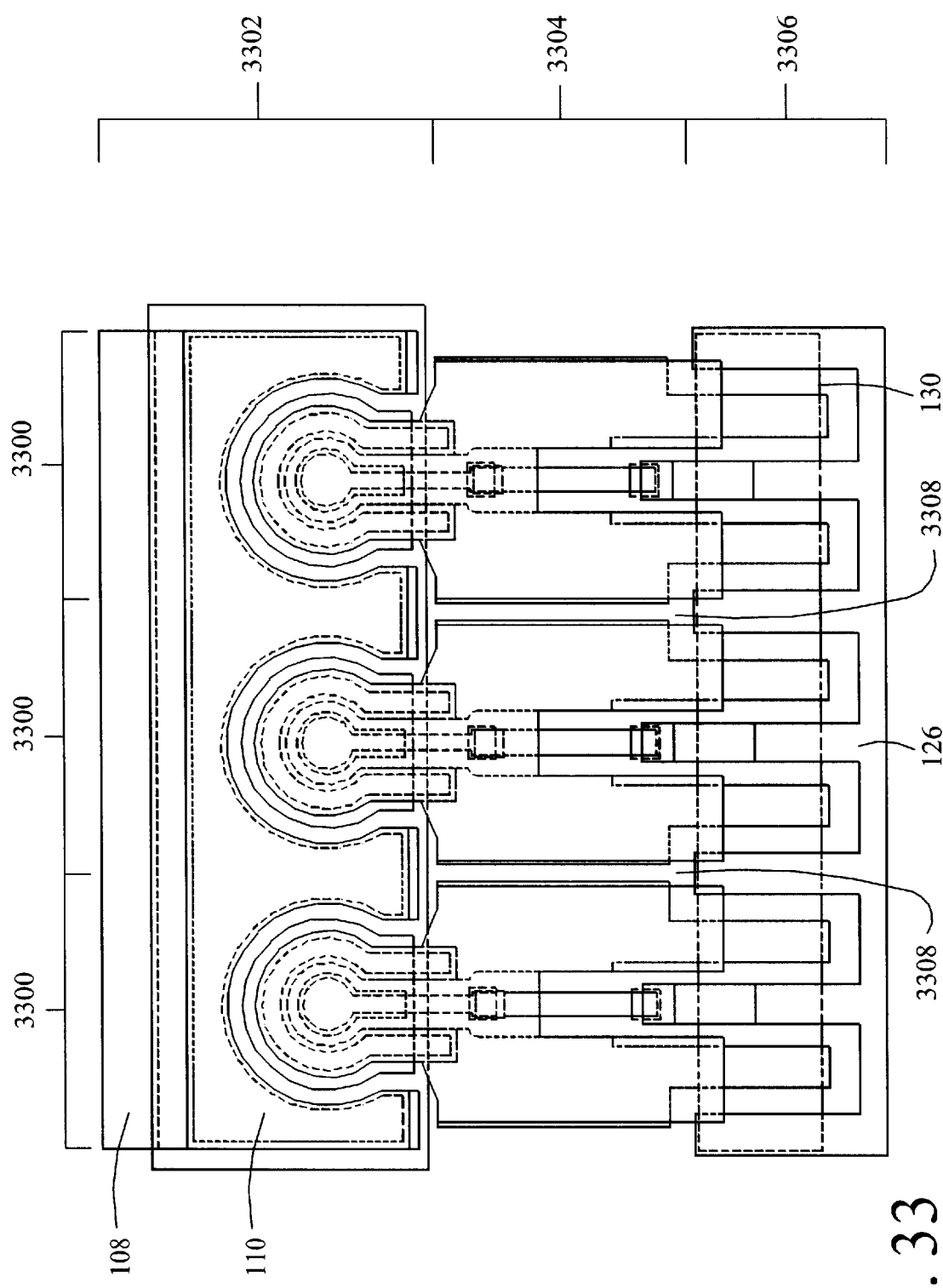
FIG. 33 is a plan view of another embodiment of the transistor layout incorporating the heat shunting capabilities of the transistor of FIG. 14 across a plurality of transistors.

FIG. 33, is a plan view of a another embodiment of the transistor layout incorporating additional heat shunting capabilities across a plurality of transistors. FIG. 33 shows three transistors 3300. Transistors 3300 may be transistors such as transistor 1400. The descriptions noted in regard to transistor 1400 apply to transistors 3300 unless noted otherwise below. Transistors 3300 include an intrinsic section 3302, a second section 3304, and a third section 3306. In the intrinsic section 3302 of transistors 3300, the collector terminal portion 108 of the second metal layer 2100, the collector contact portion 312 of the second metal layer 2100, the collector contact portion 304 of the first metal layer 1900, the collector contact 110, and the subcollector layer 320 are continuous across the plurality of transistors 3300.

In the second section 3304 of transistors 3300, gaps 3308 are between the first metal layers 1900 and the second metal layers 2100 of adjacent transistors 3300. In the third section 3306 of transistors 3300, the emitter terminal portion 126 of the first metal layer 1900 and the emitter ballast resistor 130 are continuous across the plurality of transistors 3300.

Figure 34:
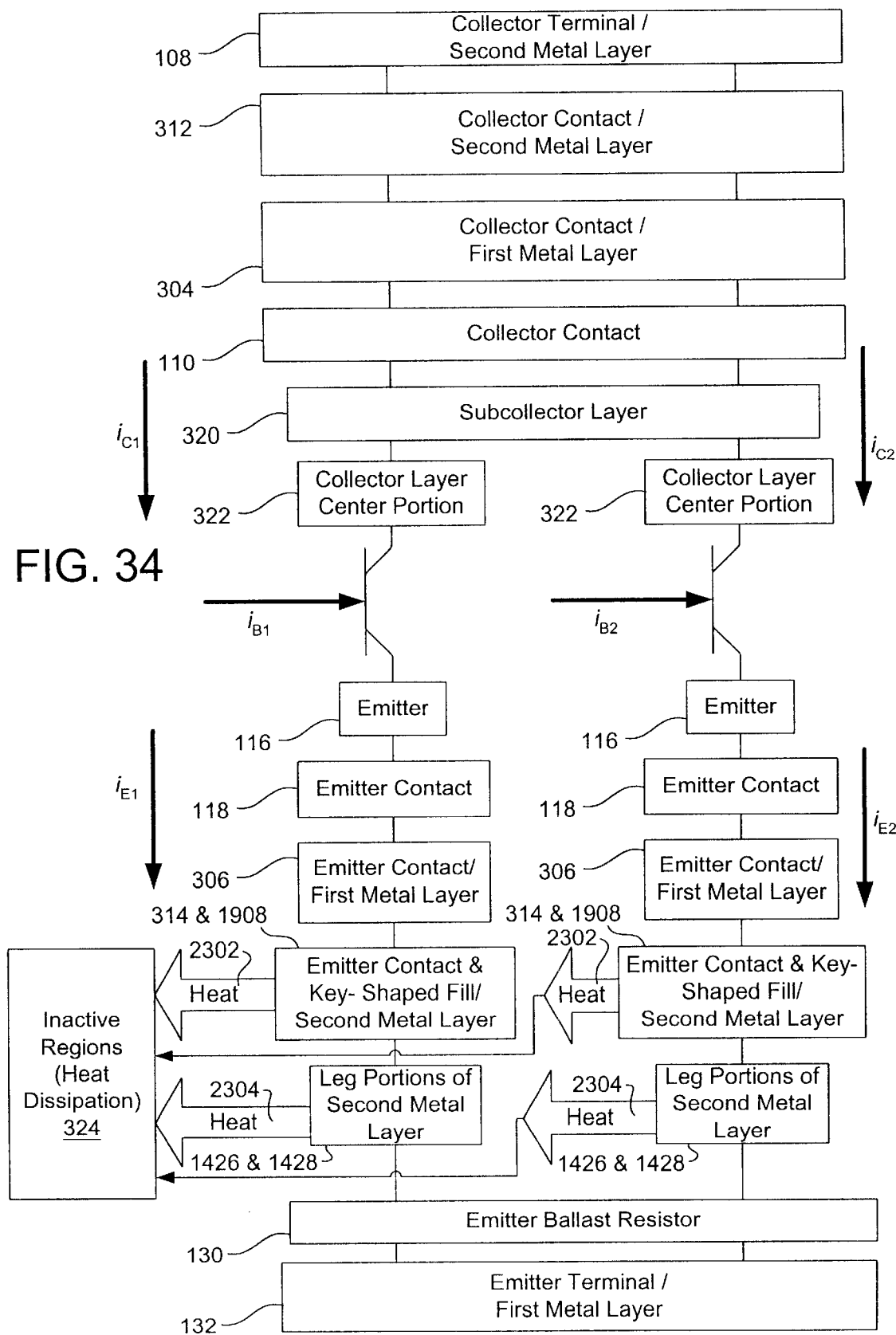
FIG. 34 is a block diagram illustrating the electrical and thermal interaction of the components included in the transistors of FIG. 33.

FIG. 34 is a block diagram illustrating the electrical and thermal interaction of some of the components of the embodiment of the transistor layout shown in FIG. 33. FIG. 34 illustrates the electrical and thermal properties across the plurality of transistors 3300 shown in FIG. 33. The descriptions noted in regard to transistor 1400 apply to the plurality of transistors 3300 shown in FIG. 33 and 34 unless noted otherwise below. For the sake of clarity, only two of the transistors 3300 are diagrammed in FIG. 34. Also, for the sake of clarity, the components of transistors 3300 carrying base current have been omitted. FIG. 34 shows a first base current $i_{B1}$ for the first of the plurality of transistors 3300 and a second base current $i_{B2}$ for the second of the plurality of transistors 3300. As shown, adjacent transistors 3300 may operate independently even though they share some common components. The components carrying first base current $i_{B1}$ and a second base current $i_{B2}$ may be the same as those shown in FIG. 23.

FIG. 34 shows a continuous collector terminal portion 108 of the second metal layer 2100, a continuous collector contact portion 312 of the second metal layer 2100, a continuous collector contact portion 304 of the first metal layer 1900, a continuous collector contact 110 and a continuous subcollector layer 320. Each transistor 3300 has a separate collector layer center portion 322.

FIG. 34 shows a continuous emitter ballast resistor 124 and a continuous emitter terminal 132 of the first metal layer 1900. The plurality of transistors 3300 have separate emitters 116, emitter contacts 118, emitter contact portions 306 of the first metal layer 1900, emitter contact portions 314 of the second metal layer 2100, and key-shaped fill portions 1908 of the second metal layer 1900. The plurality of transistors 3300 also have separate first leg portions 1434 and second leg portions 1436 of the first metal layer 1900 and first leg portions 1426 and second leg portions 1428 of the second metal layer 2100.

FIG. 34 shows the first heat path 2302 and the second heat path 2304 of the plurality of transistors 3300. First heat path 2302 and second heat path 2304 are the same as the heat paths for transistor 1400. In the embodiment shown in FIG. 34 the continuous emitter ballast resistor 130 and emitter terminal portion 132 of the first metal layer 1900 allow for more even distribution of emitter currents $i_{E1}$ and $i_{E2}$ and associated heat across the plurality of transistors 3300. Similarly, the continuous components carrying the collector currents $i_{C1}$ and $i_{C2}$ allow for more even distribution of collector currents $i_{C1}$ and $i_{C2}$ and associated heat. This allows heat to be transferred to the inactive regions 324 of relatively cooler running adjacent transistors 3300.

Figure 35:
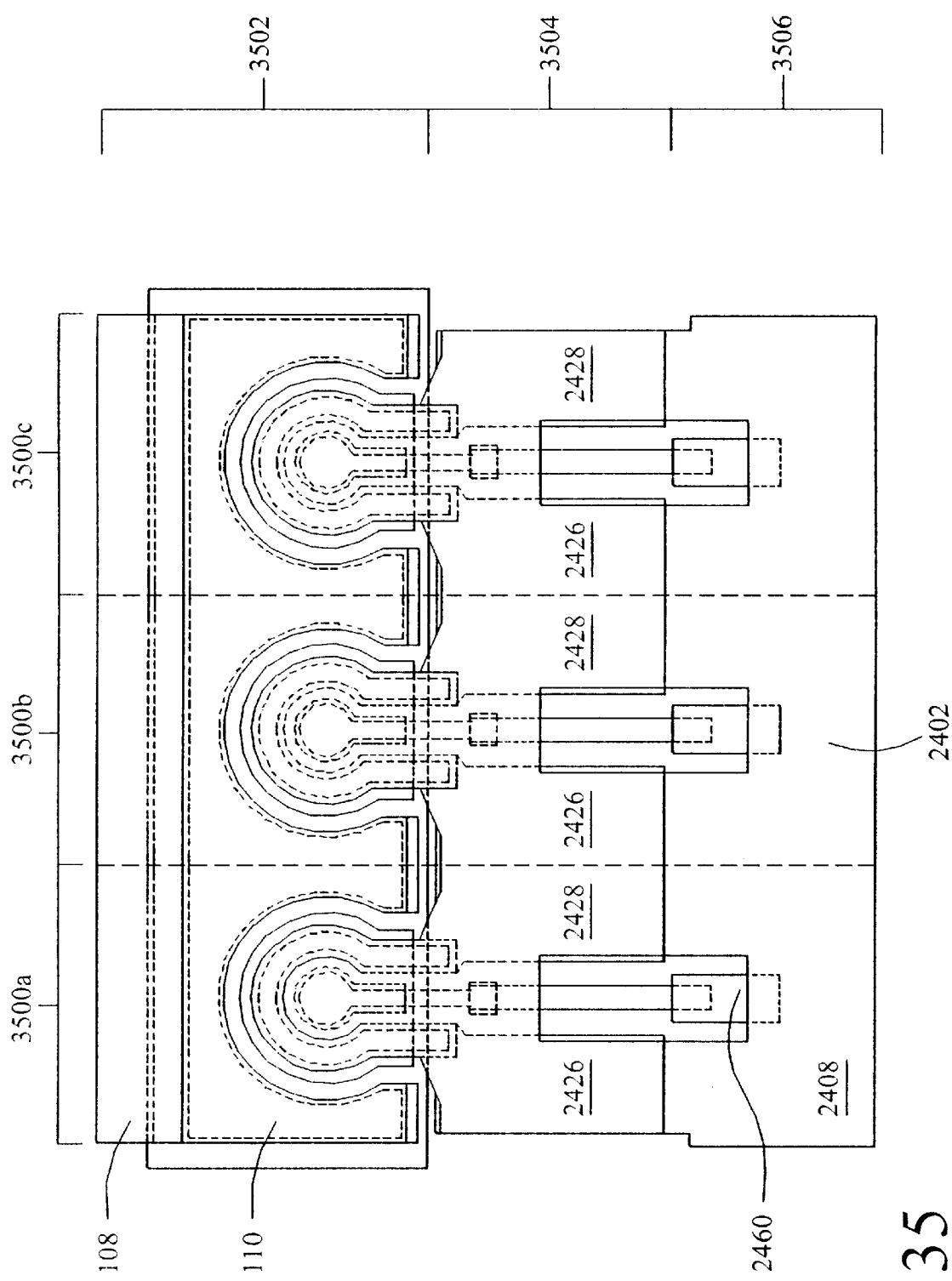
FIG. 35 is a plan view of another embodiment of the transistor layout incorporating the heat shunting capabilities of the transistor of FIG. 25 across a plurality of transistors.

FIG. 35 is a plan view of a another embodiment of the transistor layout incorporating additional heat shunting capabilities across a plurality of transistors. FIG. 35 shows three transistors 3500a, 3500b, and 3500c. Transistors 3500a, 3500b, and 3500c may be transistors such as transistor 2400 with the exception that leg portions of adjacent transistors are continuous between the adjacent transistors. The descriptions noted in regard to transistor 2400 apply to transistors 3500a, 3500b, and 3500c shown in FIG. 35 unless noted otherwise below. Transistors 3500a, 3500b and 3500c include an intrinsic section 3502, a second section 3504, and a third section 3500c. In the intrinsic section 3502, the collector terminal portion 108 of the second metal layer 3000, the collector contact portion 312 of the second metal layer 3000, the collector contact portion 304 of the first metal layer 2800, the collector contact 110, and the subcollector layer 320 are continuous across the plurality of transistors 3500a, 3500b, and 3500c.

In the second section 3504, the second leg portion 2428 of the second metal layer 3000 of transistor 3500a is continuous with the first leg portion 2426 of the second metal layer 3000 of transistor 3500b. Similarly, the second leg portion 2436 (FIG. 28) of the first metal layer 2800 of transistor 3500a is continuous with the first leg portion 2434 (FIG. 28) of the first metal layer 2800 (FIG. 28) of transistor 3500b. In the third section 3506 of transistors 3500a, 3500b, and 3500c, the emitter terminal portion 2408 of the second metal layer 3000 is continuous across the plurality of transistors 3500a, 3500b, and 3500c.

Figure 36:
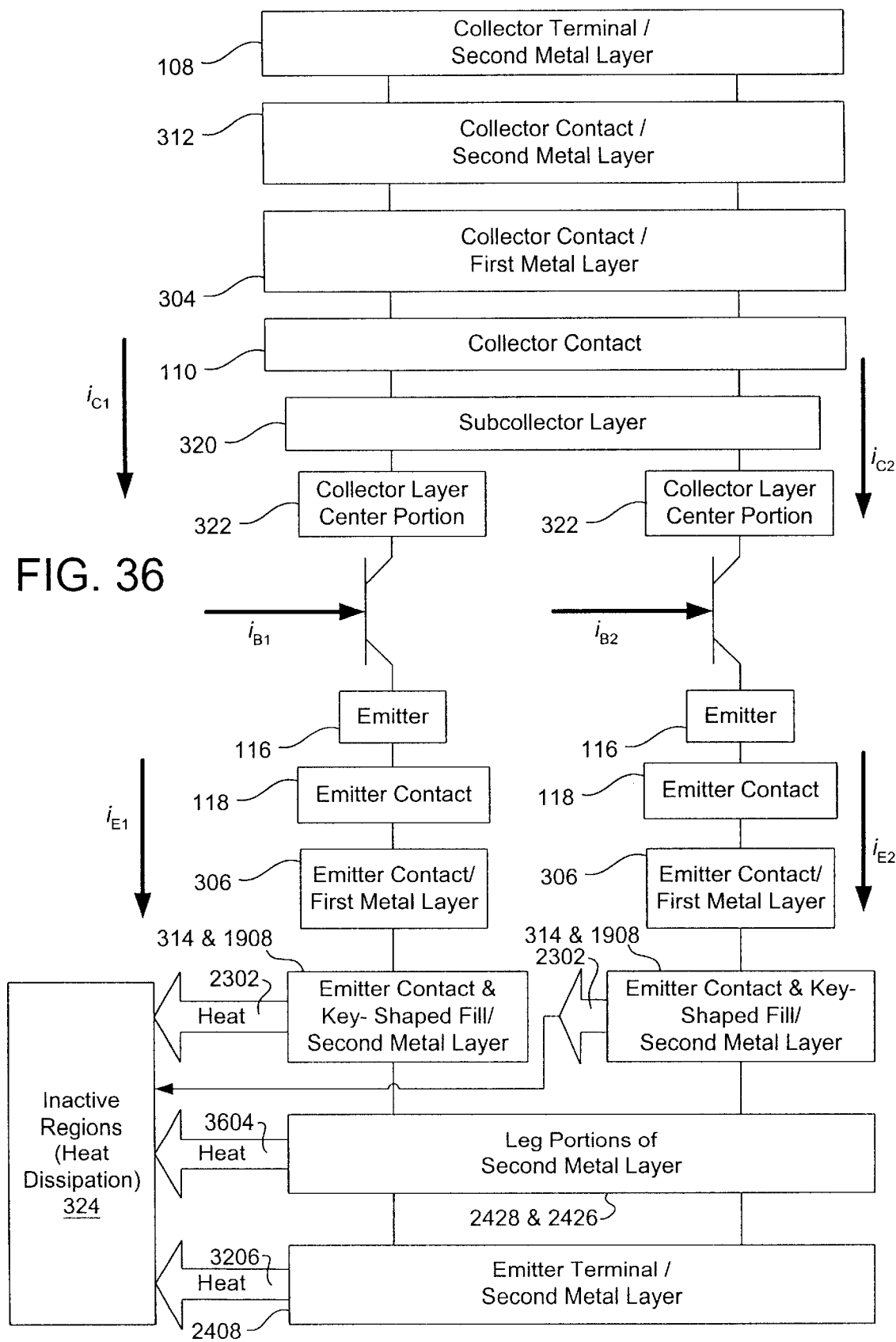
FIG. 36 is a block diagram illustrating the electrical and thermal interaction of the components included in the transistors of FIG. 35.

FIG. 36 is a block diagram illustrating the electrical and thermal interaction of some of the components of the embodiment of the transistor layout shown in FIG. 35. FIG. 36 illustrates the electrical and thermal properties across the plurality of transistors 3500a, 3500b, and 3500c shown in FIG. 35. For the sake of clarity, only two of the plurality of transistors, for example 3500a and 3500b, are diagramed in FIG. 36. Also for the sake of clarity, the components of the plurality of transistors 3500a, 3500b, and 3500c carrying base current have been omitted for clarity. FIG. 36 shows a first base current $i_{B1}$ for the first of the plurality of transistors, for example 3500a, and a second base current $i_{B2}$ for the second of the plurality of transistors, for example 3500b. The transistor components carrying first base current $i_{B1}$ and second base current $i_{B2}$ may be the same as those shown in FIG. 32. Base currents in adjacent transistors may be varied by varying base ballast resistors associated with the adjacent transistor. For example, first base current $i_{B1}$ and second base current $i_{B2}$, may be varied by varying base ballast resistors 122 associated with adjacent transistors 3500a and 3500b. In this way, the currents passing through adjacent transistors may be distributed evenly to distribute heat efficiently.

FIG. 36 shows a continuous collector terminal portion 108 of the second metal layer 3000, a continuous collector contact portion 312 of the second metal layer 3000, a continuous collector contact portion 304 of the first metal layer 2800, a continuous collector contact 110, and a continuous subcollector layer 320. The plurality of transistors 3500a, 3500b, and 3500c have separate collector layers 322.

FIGS. 35 and 36 show a continuous emitter terminal portion 2408 of the second metal layer 3000. FIG. 36 also shows a second leg portion 2428 of the second metal layer 3000 continuous with a first leg portions 2426 of the second metal layer 3000. This continuity is applicable to adjacent transistors, for example the first of the plurality of transistors 3500a and the second of the plurality of transistors 3500b. The plurality of transistor 3500a, 3500b, and 3500c have separate emitters 116, emitter contacts 118, emitter contact portions 306 of the first metal layer 2800, emitter contact portions 314 of the second metal layer 3000, and key-shaped fill portions 1908 of the second metal layer 3000.

FIG. 36 shows the first heat path 2302, a second heat path 3604, and the third heat path 3206. First heat path 2302 and third heat path 3206 are the same as the heat paths for transistor 2400. The second heat path 3604 has greater heat carrying capacity due to the continuous leg portions between adjacent transistors. In the embodiment shown in FIG. 35 the continuous emitter terminal portion 132 of the first metal layer 2800 and the continuous leg portions allow for more even distribution of emitter currents $i_{E1}$ and $i_{E2}$ and associated heat across the plurality of transistors 3500a, 3500b, and 3500c. Similarly, the continuous components carrying the collector currents $i_{C1}$ and $i_{C2}$ allow for more even distribution of collector currents $i_{C1}$ and $i_{C2}$ and associated heat. This allows heat to be transferred to the inactive region 324 of relatively cooler running adjacent transistors.

Those of ordinary skill in the art will recognize the benefits of combining the intrinsic section 102 components of transistors 100, 1400, and 2400 with the thermal transfer characteristics of transistor 1400, 2400, 3300 and the plurality of transistors shown in FIG. 35. Those having ordinary skill in the art will also recognize the thermal transfer characteristics described above can be used with conventional intrinsic section components. The current invention is not limited to the combination of intrinsic section 102 with the thermal characteristics described above.

The transistor layout as described above can be employed in power amplifiers for a wide number of analog and/or digital cellular applications. These applications can include various technologies, such as advanced mobile phone service (AMPS), code division multiple access (CDMA), digital cellular system (DCS), global system for mobile communications (GSM), time division multiple access (TDMA), 2G standards, 2.5G standards, 3G standards, and personal communications services (PCS). The transistor layout may be used with a 3V power supply, technologies that use 5V power supplies, or any other power supply voltage. For example, power transistors having the layout of the invention can be advantageously used in single band and/or multiband digital cellular telephones. The various embodiments described above may be incorporated into a transistor through processing methods that are well known to those having ordinary skill in the art.

While various embodiments of the invention have been described, it will be apparent to those of ordinary skill in the art that many more embodiments and implementations are possible that are within the scope of this invention. All such embodiments and variations are to be included herein within the scope of the present invention and protected by the following claims.

What is claimed is:

1. A transistor, comprising:
   (a) an emitter having an exterior border, the emitter comprising:
      a plurality of feed points configured to provide a plurality of current and heat paths to and from the emitter;
   (b) a plurality of spaced apart extended leg portions of a metal layer coupled to the plurality of feed points and configured to provide the plurality of heat paths from the emitter to an inactive region outside an exterior border of a sub-collector layer portion of the transistor;
   (c) a collector,
      the collector having a collector layer center portion and the subcollector layer portion,
      the collector layer center portion having an exterior border, the collector layer center portion exterior border being contoured to the emitter exterior border for a substantial percentage of the emitter exterior border,
      the subcollector layer having a top surface and a bottom surface,
      the collector layer center portion being disposed on the subcollector layer top surface;
   (d) a collector contact,
      the collector contact being disposed on the subcollector layer top surface,
      the collector contact having an interior border, the collector contact interior border being contoured to the emitter exterior border for a substantial percentage of the emitter exterior border; and
   (e) a base pedestal, the base pedestal being disposed on a top surface of the collector layer center portion.

2. The transistor of claim 1, where the emitter has an interior border.

3. The transistor of claim 2, where the emitter interior border is contoured to the emitter exterior border for a substantial percentage of the emitter exterior border.

4. The transistor of claim 2, further including:
   (f) a base contact,
      where the emitter interior border forms a void and the base contact is disposed in the void.

5. The transistor of claim 4, where the base contact has an exterior border, and where the base contact exterior border is contoured to the emitter exterior border for a substantial portion of the emitter exterior border.

6. The transistor of claim 5, where the base contact exterior border is shorter than the emitter interior border.

7. The transistor of claim 4, where the base pedestal has a top surface and a bottom surface, the collector layer center portion has a top surface and a bottom surface, the base pedestal bottom surface is in contact with the collector layer center portion top surface, and where the base contact is disposed on the top surface of the base pedestal.

8. The transistor of claim 2, where the emitter interior border forms a substantial portion of a circle.

9. The transistor of claim 2, where the emitter interior border forms a circle.

10. The transistor of claim 2, where the emitter interior border forms a square.

11. The transistor of claim 1, further including:
    (f) an emitter contact, the emitter contact having an exterior border, where the emitter contact exterior border is contoured to the emitter exterior border for a substantial percentage of the emitter exterior border.

12. The transistor of claim 11, where the emitter has a top portion and a bottom portion, the emitter bottom portion is in contact with the base pedestal, and the emitter top portion is in contact with the emitter contact.

13. The transistor of claim 1, further including:
    (f) an emitter contact, the emitter contact having an interior border, where the emitter contact interior border is contoured to the emitter exterior border for a substantial percentage of the emitter exterior border.

14. The transistor of claim 1, where the emitter exterior border forms a substantial portion of a circle.

15. The transistor of claim 1, where the emitter exterior border has a straight portion.

16. The transistor of claim 1, where the emitter exterior border has a plurality of straight portions.

17. The transistor of claim 16, where the plurality of straight portions are substantially the same length.

18. The transistor of claim 1, where the emitter exterior border forms a square.

19. The transistor of claim 1, where the emitter exterior border forms a "U" shape.

20. The transistor of claim 1, where the base pedestal has an exterior border, and where the emitter exterior border is shorter than the base pedestal exterior border.

21. The transistor of claim 20, where the base pedestal exterior border is shorter than the collector layer center portion exterior border.

22. The transistor of claim 21, where the base pedestal is configured to accept a collector current from the collector contact, the collector current being concentrated in an exterior portion of the base pedestal.

23. The transistor of claim 22, where the base pedestal is configured to accept a base current from the base contact, the base current being concentrated in an interior portion of the base pedestal.

24. The transistor of claim 22, where the base pedestal is configured to deliver an emitter current to the emitter, the emitter current being concentrated near the exterior portion of the base pedestal.

25. The transistor of claim 24, where the base pedestal has a top surface and a bottom surface, where the base pedestal is configured to accept the base current on the base pedestal top surface, where the base pedestal is configured to deliver the emitter current on the base pedestal top surface, and where the base pedestal is configured to accept a collector current on the base pedestal bottom surface.

26. The transistor of claim 1, where the collector layer center portion exterior border is shorter than the collector contact interior border.

27. The transistor of claim 1, where the transistor includes only one collector contact.

28. The transistor of claim 1, where the base pedestal has a substantially circular exterior border.

29. The transistor of claim 1, where the emitter exterior border has a substantially circular portion, and where the collector contact is configured to deliver a collector current to the emitter, the collector current primarily traveling in a path normal to the emitter exterior border substantially circular portion.

30. The transistor of claim 1, where the emitter exterior border has a straight portion, and where the collector contact is configured to deliver a collector current to the emitter, the collector current primarily traveling in a path perpendicular to the emitter exterior border substantially straight portion.

* * * * *